US011104695B2

(12) United States Patent
Ma et al.

(10) Patent No.: US 11,104,695 B2
(45) Date of Patent: Aug. 31, 2021

(54) METAL HALIDE PEROVSKITES, LIGHT-EMITTING DIODES, AND METHODS

(71) Applicant: The Florida State University Research Foundation, Inc., Tallahassee, FL (US)

(72) Inventors: Biwu Ma, Tallahassee, FL (US); Yu Tian, Tallahassee, FL (US)

(73) Assignee: The Florida State University Research Foundation, Inc., Tallahassee, FL (US)

( * ) Notice: Subject to any disclaimer, the term of this patent is extended or adjusted under 35 U.S.C. 154(b) by 0 days.

(21) Appl. No.: 16/279,088

(22) Filed: Feb. 19, 2019

(65) Prior Publication Data
US 2019/0256535 A1 Aug. 22, 2019

Related U.S. Application Data

(60) Provisional application No. 62/632,054, filed on Feb. 19, 2018.

(51) Int. Cl.
| | | |
|---|---|---|
| *H01L 51/00* | (2006.01) | |
| *C07F 7/00* | (2006.01) | |
| *C07F 7/24* | (2006.01) | |
| *C07F 1/00* | (2006.01) | |

(52) U.S. Cl.
CPC .............. *C07F 7/24* (2013.01); *C07F 1/005* (2013.01); *C07F 7/003* (2013.01); *H01L 51/0037* (2013.01); *H01L 51/0072* (2013.01); *H01L 2251/308* (2013.01)

(58) Field of Classification Search
CPC ............ H01L 51/0037; H01L 51/502; H01L 51/0072; H01L 2251/308; H01L 51/004; H01L 2251/502; H01L 31/0352; C07F 7/24; C07F 7/003; C07F 1/005; C07F 4/24; C09K 11/665
See application file for complete search history.

(56) References Cited

U.S. PATENT DOCUMENTS

| | | | | |
|---|---|---|---|---|
| 2015/0340632 | A1* | 11/2015 | Etgar | H01L 51/0032 136/255 |
| 2017/0331013 | A1* | 11/2017 | Lee | C09K 11/06 |
| 2017/0346024 | A1* | 11/2017 | Lee | B01J 13/06 |
| 2018/0301646 | A1* | 10/2018 | Kanatzidis | H01L 51/0032 |
| 2018/0348577 | A1* | 12/2018 | Pousthomis | H01L 33/50 |
| 2019/0259962 | A1* | 8/2019 | Lee | H01L 51/502 |

OTHER PUBLICATIONS

Blancon et al., "Extremely Efficient Internal Exciton Dissociation Through Edge States in Layered 2D Perovskites," Science, 2017, 355:1288-1292.

(Continued)

*Primary Examiner* — Caridad Everhart
(74) *Attorney, Agent, or Firm* — Eversheds Sutherland (US) LLP

(57) ABSTRACT

Metal halide perovskite crystals, composite materials that include metal halide perovskite crystals and a polymeric matrix material, devices that include metal halide perovskite crystals, and methods of forming metal halide perovskite crystals, composite materials, and devices. The devices may include optoelectronic devices, such as light-emitting diodes. The light-emitting diodes may emit red light.

18 Claims, 26 Drawing Sheets

(56) References Cited

OTHER PUBLICATIONS

Chen et al., "Highly Efficient Perovskite Light-Emitting Diodes Incorporating Full Film Coverage and Bipolar Charge Injection," J. Phys. Chem. Lett., 2017, 8:1810-1818.

Cho et al., "Overcoming the Electroluminescence Efficiency Limitations of Perovskite Light-Emitting Diodes," Science, 2015, 350(6265):1222-1225.

Li et al., "Efficient Light-Emitting Diodes Based on Nanocrystalline Perovskite in a Dielectric Polymer Matrix," Nano Lett., 2-015, 15:2640-2644.

Li et al., "Single-Layer Light-Emitting Diodes Using Organometal Halide Perovskite/Poly(ethylene oxide) Composite Thin Films," Adv. Mater., 2015, 27:5196-5202.

Protesecu et al., "Nanocrystals of Cesium Lead Halide Perovskites (CsPbX3, X = Cl, Br, and I): Novel Optoelectronic Materials Showing Bright Emission with Wide Color Gamut," Nano Lett., 2015, 15:3692-3696.

Sadhanala et al., "Blue-Green Color Tunable Solution Processable Organolead Chloride-Bromide Mixed Halide Perovskites for Optoelectronic Applications," Nano Lett., 2015, 15:6095-6101.

Wang et al., "Interfacial Control Toward Efficient and Low-Voltage Perovskite Light-Emitting Diodes," Adv. Mater., 2015, 27:2311-2316.

Weidman et al., "Colloidal Halide Perovskite Nanoplatelets: An Exciting New Class of Semiconductor Nanomaterials," Chem. Mater, 2017, 29:5019-5030.

Xiao et al., "Efficient Perovskite Light-Emitting Diodes Featuring Nanometre-Sized Crystallites," Nature Photonics, 2017, 11:108-115.

Zhang et al., "Enhancing the Brightness of Cesium Lead Halide Perovskite Nanocrystal Based Green Light-Emitting Devices Through the Interface Engineering with Perfluorinated Ionomer," Nano Lett., 2015, 16:1415-1420.

* cited by examiner

METAL HALIDE PEROVSKITES, LIGHT-EMITTING DIODES, AND METHODS

CROSS-REFERENCE TO RELATED APPLICATIONS

This application claims priority to U.S. Provisional Patent Application No. 62/632,054, filed Feb. 19, 2018, which is incorporated herein by reference.

STATEMENT REGARDING FEDERALLY SPONSORED RESEARCH OR DEVELOPMENT

This invention was made with government support under contract number DMR-1709116 awarded by the National Science Foundation. The government has certain rights in the invention.

BACKGROUND

Metal halide perovskites are a class of semiconductor materials having a number of possible applications in a variety of optoelectronic devices, such as photovoltaic devices, photodetector devices, lasers, and light-emitting diodes (LEDs).

Metal halide perovskites have been used as light emitters in electrically driven LEDs, especially green light emitters based on lead bromide perovskites, such as $MAPbBr_3$ and $CsPbBr_3$ (see, e.g., Cho, H. et al., Science 2015, 350, 1222; Xiao, X. et al., Nat. Photon. 2017, 11, 108; Wang, J. et al., Adv. Mater. 2015, 27, 2311; and Zhang, X. et al., Nano Lett. 2016, 16, 1415).

Metal halide perovskites also have been blended with polymers in an effort to form smooth and/or pinhole free films. A variety of polymers have been investigated, including dielectric polymers (e.g., polyimide precursor dielectric, (PIP))(see, e.g., Li, G. et al., Nano Lett. 2015, 15, 2640), ion conductive polymers (e.g., poly(ethylene oxide), (PEO)) (see, e.g., Li, J. et al., Adv. Mater. 2015, 27, 5196), and semiconductive polymers (e.g., poly(N-vinylcarbazole), (PVK))(see, e.g., Chen, P. et al., J. Phys. Chem. Lett. 2017, 8, 1810).

For full-color displays and solid-state lighting applications, highly efficient blue and red LEDs are required, in addition to green LEDs. To implement red perovskite LEDs, two major strategies have been attempted to date, one relying on mixing different halides (e.g., Protesescu, L. et al., Nano Lett. 2015, 15, 3692), and the other relying on an attempt to control quantum well structures (e.g., Blancon, J. C. et al., Science, 2017; and Weidman, M. C. et al., Chem. Mater. 2017, 29, 5019).

Mixing halides has been shown to promote color tuning of photoluminescence (PL) and electroluminescence (EL) of perovskite LEDs, however, mixed-halide perovskites often exhibit relatively low photoluminescence quantum efficiencies (PLQEs) (see, e.g., Sadhanala, A. et al., Nano Lett. 2015, 15, 6095). Mixed-halide perovskites typically suffer from low spectral stability, which is likely due at least in part to ion migration and/or phase separation under illumination and electric field.

A change of electroluminescence color during device operation also has been observed in all known LEDs based on mixed-halide perovskites. Spectral stability, therefore, is another possible drawback of perovskite LEDs. A change of PL and/or EL for mixed halide perovskites has been observed and reported, and various approaches have been taken to overcome the instability of perovskite LEDs.

Aside from using mixed halides, attempting to control quantum well structures to achieve quasi-2D perovskites represents another approach to color tuning. However, charge transport through quasi-2D perovskites typically is not as efficient as conventional metal halide perovskites with 3D structures, and this can be a limiting factor for optoelectronic devices (see, e.g., Kagan, C. R. et al., Science 1999, 286, 945).

While electrically driven perovskite LEDs have shown promise, a number of challenges remain, such as long-term stability and/or color tunability.

There remains a need for improved metal halide perovskite crystals, composite materials that include metal halide perovskite crystals, and perovskite-based devices, including red light-emitting perovskite based LEDs, that (i) have relatively high PLQEs, (ii) have improved spectral stability, (iii) are color tunable, (iv) permit a desirable level of charge transport, (v) may be made by relatively simple methods, such as solution processing, or (vi) a combination thereof.

BRIEF SUMMARY

Provided herein are metal halide perovskite crystals and composite materials that include metal halide perovskite crystals that can be used in a number of electronic devices, including light-emitting devices, such as LEDs. The light-emitting devices described herein may be red light-emitting devices. Due at least in part to the metal halide perovskite crystals and composite materials described herein, the devices herein, including the red light-emitting devices, may (i) have improved spectral stability, (ii) offer color tunability, or (iii) a combination thereof.

In one aspect, metal halide perovskite crystals are provided. In some embodiments, the metal halide perovskite crystals include a unit cell according to formula (I)—

$$(RNH_3)_2(IC)_{n-1}M_nX_{3n+1} \qquad (I);$$

wherein IC is an inorganic cation that includes a monovalent metal; R is a monovalent $C_1$-$C_{20}$ hydrocarbyl; M is a metal selected from the group consisting of Pb, Sn, Cu, Ge, Mn, Co, Bi, and Eu; X is a halide selected from the group consisting of Cl, Br, and I; and n is an integer equal to or greater than 1.

In another aspect, composite materials are provided. In some embodiments, the composite materials include a metal halide perovskite crystal as described herein, and a polymeric matrix material in which the metal halide perovskite crystal is dispersed. The composite material, in some embodiments, is a film. When the composite material is a film, the film may have a thickness of about 10 nm to about 250 nm.

In yet another aspect, electronic devices are provided. In some embodiments, the electronic devices include an electrode, a counterelectrode, and a metal halide perovskite crystal as described herein or a composite material as described herein. The composite material may be arranged between the electrode and the counterelectrode.

In a still further aspect, methods of forming a composite material are provided. In some embodiments, the methods of forming a composite material include providing a precursor liquid including (i) (IC)X, (ii) $MX_2$, (iii) an organic ammonium halide salt, (iv) a polymeric matrix material, and (v) a polar organic liquid; and depositing the precursor liquid on a surface to form a film; wherein M is a metal selected from the group consisting of Pb, Sn, Cu, Ge, Mn, Co, Bi, and Eu, IC is an inorganic cation that includes a monovalent metal, and X is a halide selected from the group consisting of Cl, Br, and I. In some embodiments, the methods also include annealing the film.

Additional aspects will be set forth in part in the description which follows, and in part will be obvious from the description, or may be learned by practice of the aspects described below. The advantages described below will be realized and attained by means of the elements and combinations particularly pointed out in the appended claims. It is to be understood that both the foregoing general description and the following detailed description are exemplary and explanatory only and are not restrictive.

DETAILED DESCRIPTION

Figure 1:
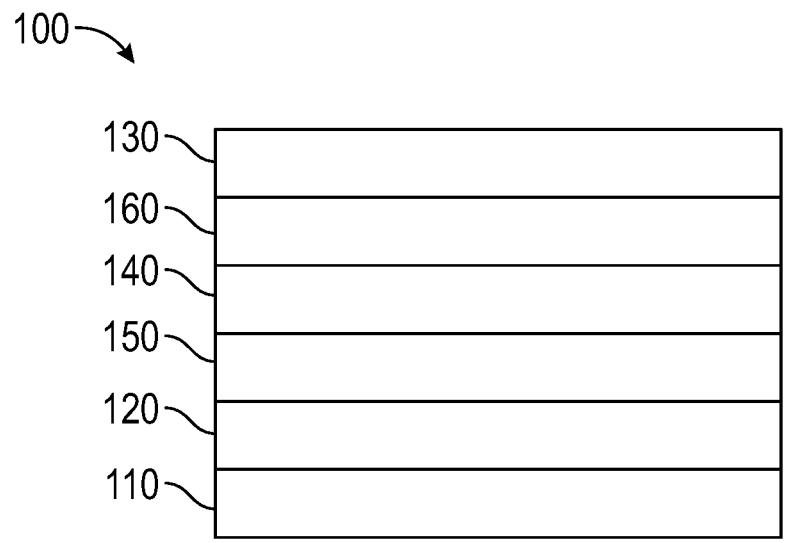
FIG. 1 is a schematic of an embodiment of an electronic device.

Provided herein are embodiments of perovskite LEDs, including red light-emitting perovskite LEDs, having improved spectral stability. In some embodiments, the red light-emitting perovskite LEDs provided herein include quasi-2D perovskite/PEO composite films as a light-emitting layer.

In some embodiments, the devices provided herein include highly efficient red light-emitting perovskite LEDs having desirable spectral stability. In some embodiments, the devices include quasi-2D perovskite/PEO composite films as a light-emitting layer. The devices may have desirable color tunability and/or exceptional emission spectral stability, which, in some embodiments, is due, at least in part, to embodiments of the quasi-2D perovskite/PEO systems provided herein.

In some embodiments, the devices herein include cesium lead iodide perovskites, which may have improved thermal and/or moisture stability. In some embodiments, the methods provided herein include facile one-step solution processing followed by a relatively low temperature thermal annealing. The methods, in some embodiments, produce quasi-2D perovskite/PEO composite films that exhibit tunable photoluminescences from red (peaked @ 615 nm) to deep-red (peaked @ 676 nm).

The color tuning, in some embodiments, is achieved by synthetic control of the thickness of layered quantum well structures in quasi-2D perovskites, such as $(BA)_2(Cs)_{n-1}[Pb_nI_{3n+1}]$, wherein BA is benzyl ammonium.

Also provided herein are electrically driven LEDs with emissions peaked at 638 nm, 664 nm, 680 nm, and 690 nm, which exhibit relatively high brightness and EQEs. In some embodiments, the devices herein include a red light-emitting perovskite LED with an emission peaked at 680 nm, a brightness of 1392 cd/m$^2$, and an EQE % of 6.23%. In some embodiments, the red light-emitting LEDs provided herein exhibit desirable spectral stability and device performance stability during device operation.

Metal Halide Perovskite Crystals

Metal halide perovskite crystals are provided herein. In some embodiments, the metal halide perovskite crystals have a unit cell according to formula (I):

$$(RNH_3)_2(IC)_{n-1}M_nX_{3n+1} \qquad (I);$$

wherein IC is an inorganic cation comprising a monovalent metal; R is a monovalent $C_1$-$C_{20}$ hydrocarbyl; M is a metal selected from the group consisting of Pb, Sn, Cu, Ge, Mn, Co, Bi, and Eu; X is a halide selected from the group consisting of Cl, Br, and I; and n is an integer equal to or greater than 1. In some embodiments, n is an integer greater than or equal to 2.

As used herein, the phrase "metal halide perovskite crystals" generally refers to metal halide perovskites having a crystalline structure, wherein the repeating unit of the crystalline structure is the unit cell according to formula (I). The crystalline structure may be formed by an array of the unit cells according to formula (I), the array extending in one, two, or three dimensions. The "metal halide perovskite crystals" may include a plurality of crystals, which, as described herein, may be dispersed in another material, such as a polymeric matrix material.

In some embodiments, the metal halide perovskite crystals have a quasi-2D structure. In some embodiments, the metal halide perovskite crystals have a 2D structure. In some embodiments, the metal halide perovskite crystals have a 3D structure.

In some embodiments, the metal halide perovskite crystals have a unit cell according to formula (I), wherein n is 2 to 9. In some embodiments, the metal halide perovskite crystals have a unit cell according to formula (I), wherein n is 2 to 9, and the metal halide perovskite crystals have a quasi-2D structure.

The inorganic cation (IC) of the metal halide perovskite crystals described herein may include any monovalent metal. The phrase "monovalent metal", as used herein, refers to a metal, wherein each atom of the metal is capable of forming only one covalent bond with another atom. The monovalent metal, in some embodiments, is an alkali metal. The alkali metal may include Cs.

In some embodiments, the metal halide perovskite crystals described herein have a unit cell according to formula (I), wherein M is Pb.

In some embodiments, the metal halide perovskite crystals described herein have a unit cell according to formula (I), wherein X is I.

In some embodiments, the metal halide perovskite crystals described herein have a unit cell according to formula (I), wherein M is Pb, and X is I.

In some embodiments, the metal halide perovskite crystals described herein have a unit cell according to formula (I), wherein M is Pb, X is I, and the monovalent metal is Cs.

In some embodiments, the metal halide perovskite crystals described herein have a unit cell according to formula (I), wherein M is Pb, X is I, the monovalent metal is Cs, n is 2 to 9, and the metal halide perovskite crystals have a quasi-2D structure.

In some embodiments, R is a monovalent $C_1$-$C_{20}$ hydrocarbyl. In some embodiments, R is a monovalent $C_7$-$C_{18}$ hydrocarbyl. In some embodiments, R is a monovalent $C_7$-$C_8$ hydrocarbyl. In some embodiments, the monovalent $C_1$-$C_{20}$ hydrocarbyl is a benzyl moiety.

The phrases "$C_1$-$C_{20}$ hydrocarbyl," "$C_7$-$C_{18}$ hydrocarbyl," "$C_7$-$C_8$ hydrocarbyl," and the like, as used herein, generally refer to aliphatic, aryl, or arylalkyl groups containing 1 to 20, 7 to 18, or 7 to 8 carbon atoms, respectively.

Examples of aliphatic groups, in each instance, include, but are not limited to, an alkyl group, a cycloalkyl group, an alkenyl group, a cycloalkenyl group, an alkynyl group, an alkadienyl group, a cyclic group, and the like, and includes all substituted, unsubstituted, branched, and linear analogs or derivatives thereof, in each instance having 1 to about 20 carbon atoms, 7 to 18 carbon atoms, 7 to 8 carbon atoms, etc. Examples of alkyl groups include, but are not limited to, methyl, ethyl, propyl, isopropyl, n-butyl, t-butyl, isobutyl, pentyl, hexyl, isohexyl, heptyl, 4,4-dimethylpentyl, octyl, 2,2,4-trimethylpentyl, nonyl, decyl, undecyl and dodecyl. Cycloalkyl moieties may be monocyclic or multicyclic, and examples include cyclopropyl, cyclobutyl, cyclopentyl, cyclohexyl, and adamantyl. Additional examples of alkyl moieties have linear, branched and/or cyclic portions (e.g., 1-ethyl-4-methyl-cyclohexyl). Representative alkenyl moieties include vinyl, allyl, 1-butenyl, 2-butenyl, isobutylenyl, 1-pentenyl, 2-pentenyl, 3-methyl-1-butenyl, 2-methyl-2-butenyl, 2,3-dimethyl-2-butenyl, 1-hexenyl, 2-hexenyl, 3-hexenyl, 1-heptenyl, 2-heptenyl, 3-heptenyl, 1-octenyl, 2-octenyl, 3-octenyl, 1-nonenyl, 2-nonenyl, 3-nonenyl, 1-decenyl, 2-decenyl and 3-decenyl. Representative alkynyl moieties include acetylenyl, propynyl, 1-butynyl, 2-butynyl, 1-pentynyl, 2-pentynyl, 3-methyl-1-butynyl, 4-pentynyl, 1-hexynyl, 2-hexynyl, 5-hexynyl, 1-heptynyl, 2-heptynyl, 6-heptynyl, 1-octynyl, 2-octynyl, 7-octynyl, 1-nonynyl, 2-nonynyl, 8-nonynyl, 1-decynyl, 2-decynyl and 9-decynyl. Examples of aryl or arylalkyl moieties include, but are not limited to, anthracenyl, azulenyl, biphenyl, fluorenyl, indan, indenyl, naphthyl, phenanthrenyl, phenyl, 1,2,3,4-tetrahydro-naphthalene, tolyl, xylyl, mesityl, benzyl, and the like, including any heteroatom substituted derivative thereof.

Unless otherwise indicated, the term "substituted," when used to describe a chemical structure or moiety, refers to a derivative of that structure or moiety wherein one or more of its hydrogen atoms is substituted with a chemical moiety or functional group such as alcohol, alkoxy, alkanoyloxy, alkoxycarbonyl, alkenyl, alkyl (e.g., methyl, ethyl, propyl, t-butyl), alkynyl, alkylcarbonyloxy (—OC(O)alkyl), amide (—C(O)NH-alkyl- or -alkylNHC(O)alkyl), tertiary amine (such as alkylamino, arylamino, arylalkylamino), aryl, aryloxy, azo, carbamoyl (—NHC(O)O— alkyl- or —OC(O)NH-alkyl), carbamyl (e.g., $CONH_2$, as well as CONH-alkyl, CONH-aryl, and CONH-arylalkyl), carboxyl, carboxylic acid, cyano, ester, ether (e.g., methoxy, ethoxy), halo, haloalkyl (e.g., —$CCl_3$, —$CF_3$, —$C(CF_3)_3$), heteroalkyl, isocyanate, isothiocyanate, nitrile, nitro, phosphodiester, sulfide, sulfonamido (e.g., $SO_2NH_2$), sulfone, sulfonyl (including alkylsulfonyl, arylsulfonyl and arylalkylsulfonyl), sulfoxide, thiol (e.g., sulfhydryl, thioether) or urea (—NHCONH-alkyl-).

In some embodiments, the metal halide perovskite crystals described herein have a unit cell according to formula (I), wherein R is a monovalent $C_1$-$C_{20}$ hydrocarbyl, M is Pb, X is I, the monovalent metal is Cs, n is 2 to 9, and the metal halide perovskite crystal has a quasi-2D structure.

In some embodiments, the metal halide perovskite crystals described herein have a unit cell according to formula (I), wherein R is a monovalent $C_7$-$C_{18}$ hydrocarbyl, M is Pb, X is I, the monovalent metal is Cs, n is 2 to 9, and the metal halide perovskite crystal has a quasi-2D structure.

In some embodiments, the metal halide perovskite crystals described herein have a unit cell according to formula (I), wherein R is a monovalent $C_7$-$C_8$ hydrocarbyl, M is Pb, X is I, the monovalent metal is Cs, n is 2 to 9, and the metal halide perovskite crystal has a quasi-2D structure.

In some embodiments, the metal halide perovskite crystals described herein have a unit cell according to formula (I), wherein R is a benzyl moiety, M is Pb, X is I, the monovalent metal is Cs, n is 2 to 9, and the metal halide perovskite crystal has a quasi-2D structure.

Composite Materials

Also provided herein are composite materials. In some embodiments, the composite materials include a metal halide perovskite crystal as described herein, and a polymeric matrix material. The composite materials generally may be of any size and/or shape (e.g., a film, particles, etc.). In some embodiments, the composite material is a film.

As used herein, the phrase "polymeric matrix material" generally refers to a substance that includes a polymer or polymer pre-cursor. The term "polymer", as used herein, refers to all substances formed of one or more monomers, including, but not limited to, oligomers, comb polymers, branched polymers, linear polymers, crosslinked polymers, star polymers, etc.

In some embodiments, the polymeric matrix material includes poly(ethylene oxide) (PEO), polyimide precursor dielectric (PIP), poly(N-vinylcarbazole) (PVK), or a combination thereof. In some embodiments, the polymeric matrix material includes PEO.

In some embodiments, the metal halide perovskite is dispersed substantially evenly in the polymeric matrix material.

In some embodiments, the composite materials described herein are films having a thickness of about 10 nm to about 250 nm, about 10 nm to about 200 nm, about 10 nm to about 150 nm, about 10 nm to about 100 nm, about 25 nm to about 100 nm, about 25 nm to about 75 nm, or about 50 nm.

Devices

Also provided herein are electronic devices. In some embodiments, the electronic devices include an electrode, a counterelectrode, and a metal halide perovskite crystal as described herein, wherein the metal halide perovskite crystal is arranged between the electrode and the counterelectrode. In some embodiments, the electronic devices include an electrode, a counterelectrode, and a composite material as described herein, wherein the composite material is arranged between the electrode and the counterelectrode. The electrode or counterelectrode may be deposited on a substrate. The substrate may be formed of any material, such as metal or glass. The substrate, in some embodiments, is transparent.

The electronic devices described herein may include any optoelectronic device, including, but not limited to, light-emitting diodes or photovoltaic devices, such as solar cells. In some embodiments, the electronic device is a light-emitting diode (LED), and a metal halide perovskite crystal or composite material described herein emits light. In some embodiments, the metal halide perovskite crystal or composite material emits red light.

The electronic devices described herein may also include at least one of a layer selected from the group consisting of a hole transporting layer, a hole injecting layer, a hole blocking layer, an electron transporting layer, an electron injecting layer, and an electron blocking layer. Any known material(s), including those described herein, may be used in these layers. In some embodiments, a single layer may act as one type of layer or two types of layer. For example, a single layer may act as a hole transporting layer and an electron blocking layer.

In some embodiments, the electronic devices described herein also include a hole transporting layer, and a hole injecting layer; wherein the hole transporting layer is arranged between the composite material and the electrode, and the hole injecting layer is arranged between the hole transporting layer and the electrode.

In some embodiments, the electronic devices described herein also include an electron transporting layer arranged between the composite material and the counterelectrode.

An embodiment of an electronic device is depicted at FIG. 1. FIG. 1 is a schematic of a light-emitting device 100 that includes a substrate 110, an electrode 120, and a counterelectrode 130. Arranged between the electrode 120 and the counterelectrode 130 is a composite material 140 as described herein. Arranged between and in contact with both the composite material 140 and the electrode 120 is a hole transporting layer 150. Arranged between and in contact with both the composite material 140 and the counterelectrode 130 is an electron transporting layer 160.

In some embodiments, the electrode is a cathode, and the counterelectrode is an anode. In some embodiments, the electrode is an anode, and the counterelectrode is a cathode. The cathode may include aluminum, and the anode may include indium tin oxide (ITO).

In some embodiments, the electrode is a anode, the counterelectrode is an cathode, the composite material emits light (such as red light, in some embodiments), and the device also includes a hole injecting layer arranged adjacent to an in contact with the cathode; a hole transporting layer arranged between and in contact with both the hole injecting layer and the composite material; and an electron transport layer arranged between and in contact with both the composite material and the anode.

Figure 2:
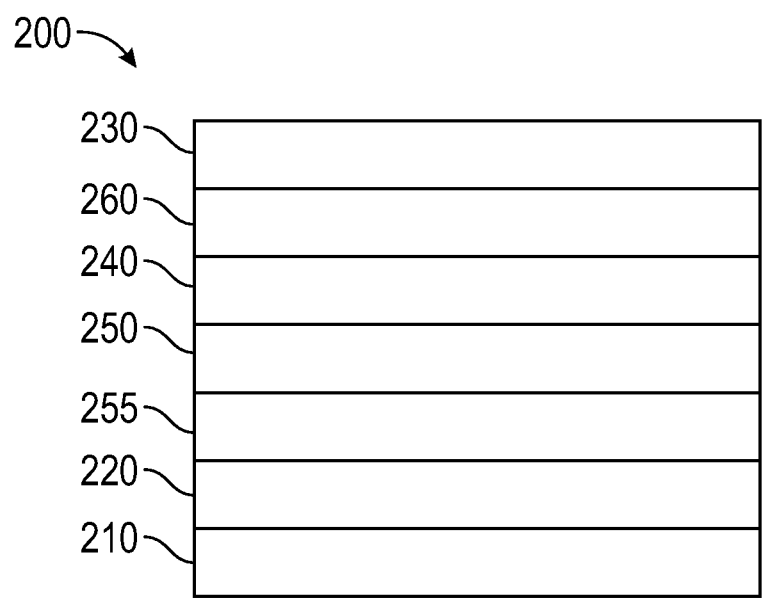
FIG. 2 is a schematic of an embodiment of an electronic device.

FIG. 2 depicts a schematic of an embodiment of a device that includes a substrate 210, an anode 220, and a cathode 230. Arranged between the anode 220 and the cathode 230 is a composite material 240 as described herein. A hole transporting layer 250 is arranged between the composite material 240 and the anode 220, and in contact with the composite material 240. A hole injecting layer 255 is arranged between and in contact with both the hole transporting layer 250 and the anode 220. Arranged between and in contact with both the composite material 240 and the cathode 230 is an electron transporting layer 260.

The hole injecting layers of the devices described herein may have a thickness of about 10 nm to about 100 nm, about 20 nm to about 60 nm, about 30 nm to about 50 nm, or about 40 nm. In some embodiments, the devices include a hole injecting layer, and the hole injecting layer comprises poly(3,4-ethylenedioxythiophene)-poly(styrenesulfonate) (PEDOT:PSS).

The hole transporting layers of the devices described herein may have a thickness of about 10 nm to about 50 nm, about 10 nm to about 30 nm, or about 20 nm. In some embodiments, the devices include a hole transporting layer, and the hole transporting layer includes poly(4-butylphenyl-diphenyl-amine) (poly-TPD).

The electron transporting layers of the devices described herein may have a thickness of about 10 nm to about 100 nm, about 20 nm to about 60 nm, about 30 nm to about 50 nm, or about 40 nm. In some embodiments, the devices include an electron transporting layer, and the electron transporting layer includes 2,2',2"-(1,3,5-benzinetriyl)-tris(1-phenyl-1-H-benzimidazole) (TPBi).

Other known materials may be used for the charge transporting, charge blocking, and/or charge injecting layers of the devices described herein. The devices also may be encapsulated with known materials.

Methods

Also provided herein are methods of forming metal halide perovskites and composite materials. In some embodiments, the methods of forming a composite material include providing a precursor liquid that includes (i) (IC)X, (ii) $MX_2$, (iii) an organic ammonium halide salt, (iv) a polymeric matrix material, and (v) a polar organic liquid; and depositing the precursor liquid on a surface to form a film; wherein M is a metal selected from the group consisting of Pb, Sn, Cu, Ge, Mn, Co, Bi, and Eu, IC is an inorganic cation comprising a monovalent metal, and X is a halide selected from the group consisting of Cl, Br, and I.

In some embodiments, the methods also include annealing the composite material. The annealing of the composite material may include subjecting the composite material to a temperature of about 50° C. to about 90° C., or about 70° C. for a time effect to anneal the composite material.

In some embodiments, the methods include providing a precursor liquid that includes (IC)X, $MX_2$, an organic ammonium halide salt, and a polar organic liquid; and depositing the precursor liquid onto a surface to form a film; wherein M is a metal selected from the group consisting of Pb, Sn, Cu, Ge, Mn, Co, Bi, and Eu; and X is a halide ion selected from the group consisting of Cl, Br, and I.

In some embodiments, the organic ammonium halide salt is benzyl ammonium iodide. In some embodiments, IC is an alkali metal, such as Cs. In some embodiments, X is I. In some embodiments, M is Pb. In some embodiments, the polar organic liquid includes dimethyl sulfoxide (DMSO).

In some embodiments, the concentrations of (IC)X and $MX_2$ in the precursor liquid, independently, are about 0.2 M to about 0.5 M.

In some embodiments, the polar organic liquid also includes acetic acid.

Any known technique may be used to deposit a precursor liquid on a surface to form a film. In some embodiments, the depositing the precursor liquid on a surface includes spin casting the precursor liquid onto the surface. The surface may include a layer of a device described herein, such as a hole transporting layer or an electron transporting layer.

EXAMPLES

The present invention is further illustrated by the following examples, which are not to be construed in any way as imposing limitations upon the scope thereof. On the contrary, it is to be clearly understood that resort may be had to various other aspects, embodiments, modifications, and equivalents thereof which, after reading the description herein, may suggest themselves to one of ordinary skill in the art without departing from the spirit of the present invention or the scope of the appended claims. Thus, other aspects of this invention will be apparent to those skilled in the art from consideration of the specification and practice of the invention disclosed herein.

Example 1—Preparation of Quasi-2D Perovskite Films

CsI and $PbI_2$ were dissolved in DMSO at a concentration of 0.35 M. A small amount (1% volume ratio) of acetic acid was added into the solution to increase the solubility of both salts. Benzyl ammonium iodide (BAI) was added to the precursor at molar ratios of 55:45 (No. 1), 50:50 (No. 2), 45:55 (No. 3), and 40:60 (No. 4) to synthesize quasi-2D perovskites with different thicknesses of quantum well structures.

PEO was dissolved in DMSO with a concentration of 10 mg/mL. The quasi-2D perovskite/PEO solutions were prepared by mixing quasi-2D perovskite and PEO precursors at a 1 to 1 volume ratio. Before spin coating, the mixture precursor was filtered with a glass fiber syringe filter. The mixture precursor was spun-cast at 8000 rpm for 60 seconds, followed by thermal annealing at 70° C. for 20 minutes. Corresponding control samples without PEO were also prepared as No. 5, No. 6, No. 7, and No. 8. Both quasi-2D perovskite/PEO composite films and neat quasi-2D perovskite films were prepared by spin coating the mixture solutions at 8000 rpm for 60 s, followed by thermal annealing at 70° C. for 20 minutes.

Thermal annealing was used in this example to make light-emitting films. Cesium lead iodide perovskites can have a stable non-emissive yellow phase at room temperature, and unlike the high temperature annealings at 120° C. that have been used to convert bulk $CsPbI_3$ from the yellow phase to black phase, a much lower temperature of 70° C. was used in this example, and shown to be sufficient for the phase transformation of the quasi-2D perovskites. Not wishing to be bound by any particular theory, this could be attributed to the confinement of cesium lead iodide by BA cations, which facilitated the conversion within small domains.

Figure 3:
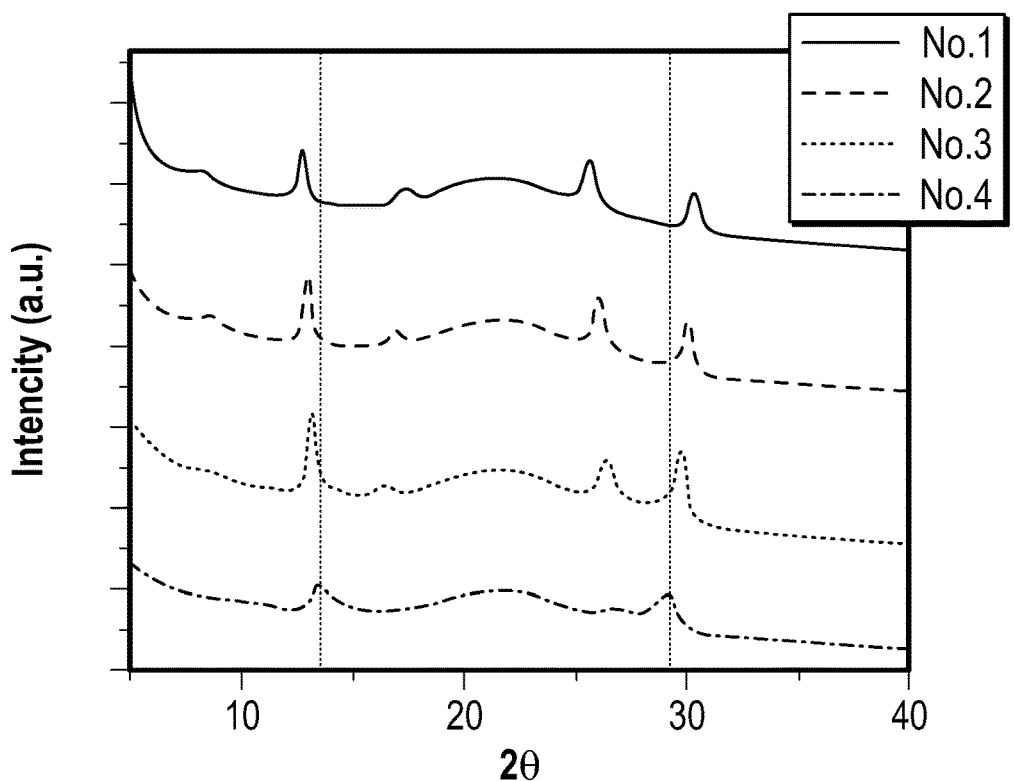
FIG. 3 depicts powder X-ray diffraction spectra of embodiments of quasi-2D perovskite/PEO films on glass substrates.

The X-ray diffraction (XRD) spectra of sample Nos. 1 to 4, which are depicted at FIG. 3, confirmed the formation of quasi-2D perovskites with a stable crystalline black phase.

For film No. 4, the diffraction peaks at around 13.8° and 29.0° revealed (100) and (200) crystalline planes of black phase $CsPbI_3$, respectively, while no obvious diffraction peaks corresponding to layered quasi-2D perovskites were observed. This indicated the formation of quasi-2D perovskite films with a large "n" (n=the number of $PbI_4$ perovskite layers for film No. 4).

Figure 4:
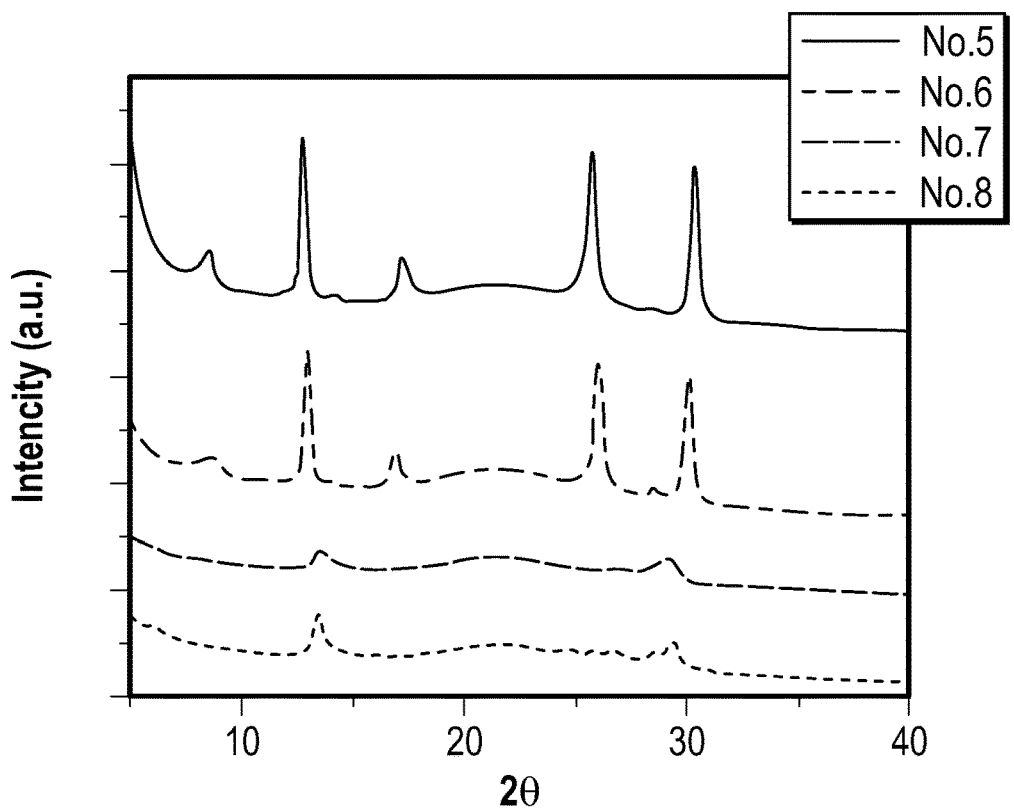
FIG. 4 depicts powder X-ray diffraction spectra of embodiments of control quasi-2D perovskite films without PEO.

Likely due to the increase of the ratio of BA cations, layered quasi-2D perovskite diffraction peaks appeared for films No. 1, No. 2, and No. 3. For films No. 1, No. 2 and No. 3, there were diffraction peaks at about 25.7°, 26.1° and 26.4° respectively, which was ascribed to the crystallographic plane (202). Identical XRD patterns were observed for quasi-2D perovskite films without PEO, as depicted at FIG. 4.

2D and 3D atomic force spectroscopy (AFM) images were collected of quasi-2D perovskite/PEO composite films No. 1, No. 2, No. 3, and No. 4.

Pinhole free smooth films with very low surface roughness were obtained for all the film samples of this example. For instance, film No. 3 had a low surface roughness with a root mean square roughness ($R_q$) of 1.41 nm, which was significantly lower than that of its neat quasi-2D perovskite counterpart, for which $R_q$ was 2.69 nm. The addition of PEO also prevented the formation of large quasi-2D perovskite crystals.

The optical properties of the quasi-2D perovskite/PED composite films were characterized by UV-Vis absorption spectroscopy and PL spectroscopy. Optical photographs were taken of quasi-2D perovskites/PEO composite films under ambient light and UV illumination. All of the composite films showed very strong photoluminescence under UV illumination.

Figure 5:
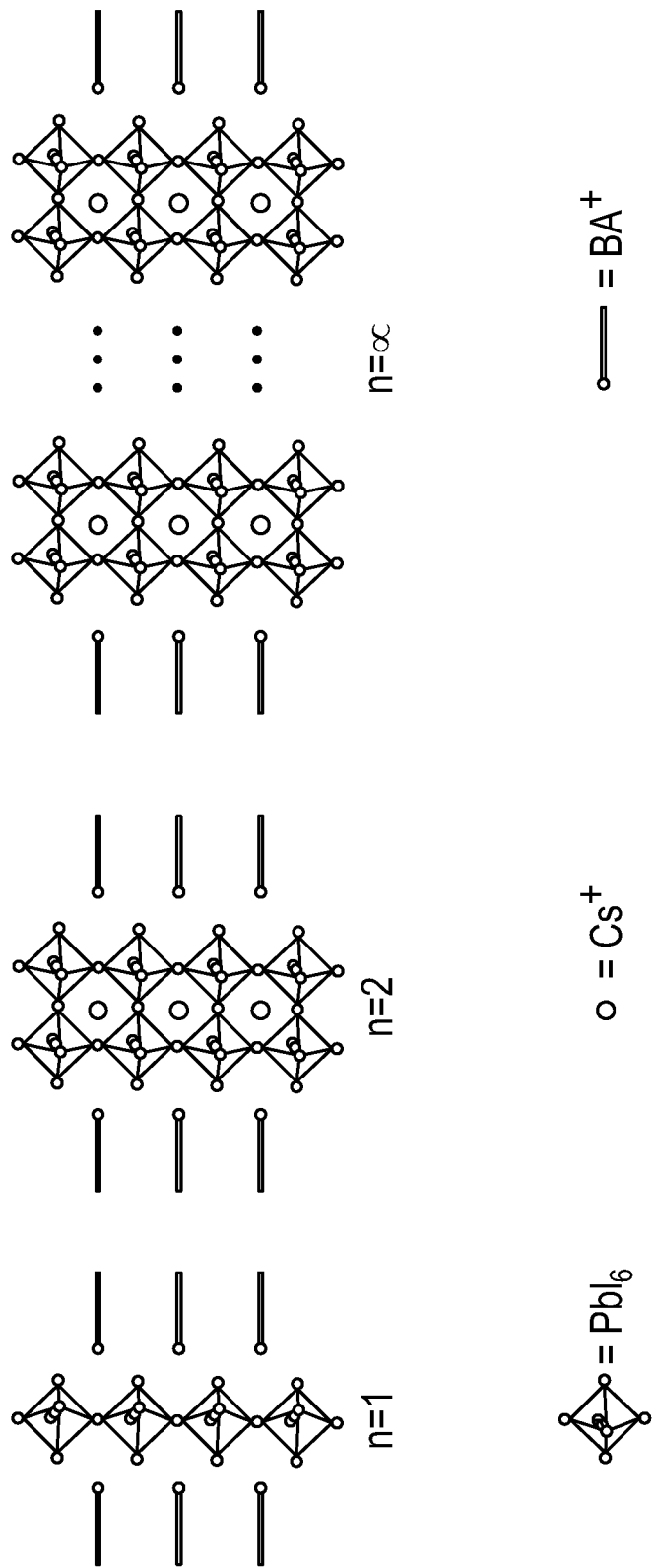
FIG. 5 depicts crystal structures of embodiments of quasi-2D perovskites.
Figure 6:
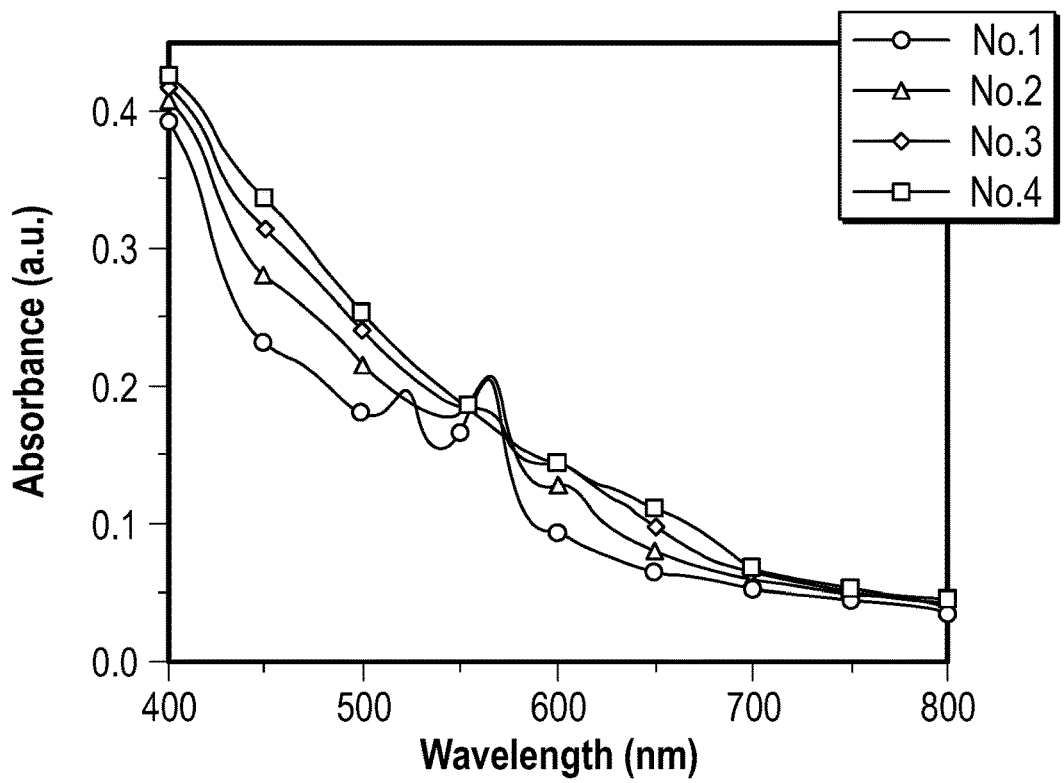
FIG. 6 depicts absorption spectra of embodiments of quasi-2D perovskite/PEO composite films.

FIG. 5 depicts crystal structures of quasi-2D perovskites having the unit cell of this example: $(BA)_2(Cs)_{n-1}[Pb_nI_{3n+1}]$, wherein n is 1 to ∞. FIG. 6 depicts absorption spectra of quasi-2D perovskite/PEO composite films (No. 1-4), and FIG. 7 depicts photoluminescence spectra of quasi-2D perovskite/PEO composite films (No. 1-4).

The multiple absorption peaks suggested that films No. 1, No. 2 and No. 3 likely contained mixed quasi-2D structures with different n values. Film No. 1 showed strong absorption peaks at 2.36 eV, 2.19 eV, and 2.05 eV, which indicated that film No. 1 was likely a mixture of quasi 2D perovskites, wherein n=1, 2, and 3.

Meanwhile, for film No. 2, exciton absorption peaks of 2.19 eV, 2.05 eV, and 1.96 eV suggested that the quasi 2D perovskite films had a variety of n values (n=2, 3, and 4) as well. For No. 3, the strong exciton absorption peaks suggested that the films included quasi 2D perovskites with a large n. The red-shifted absorption spectra for film No. 4 indicated quasi-2D perovskites having a large n, which was in line with XRD results as discussed herein. One of the remarkable and useful features of these quasi-2D perovskites was the fact that their color could be tuned by taking advantage of the quantum size effect.

Figure 7:
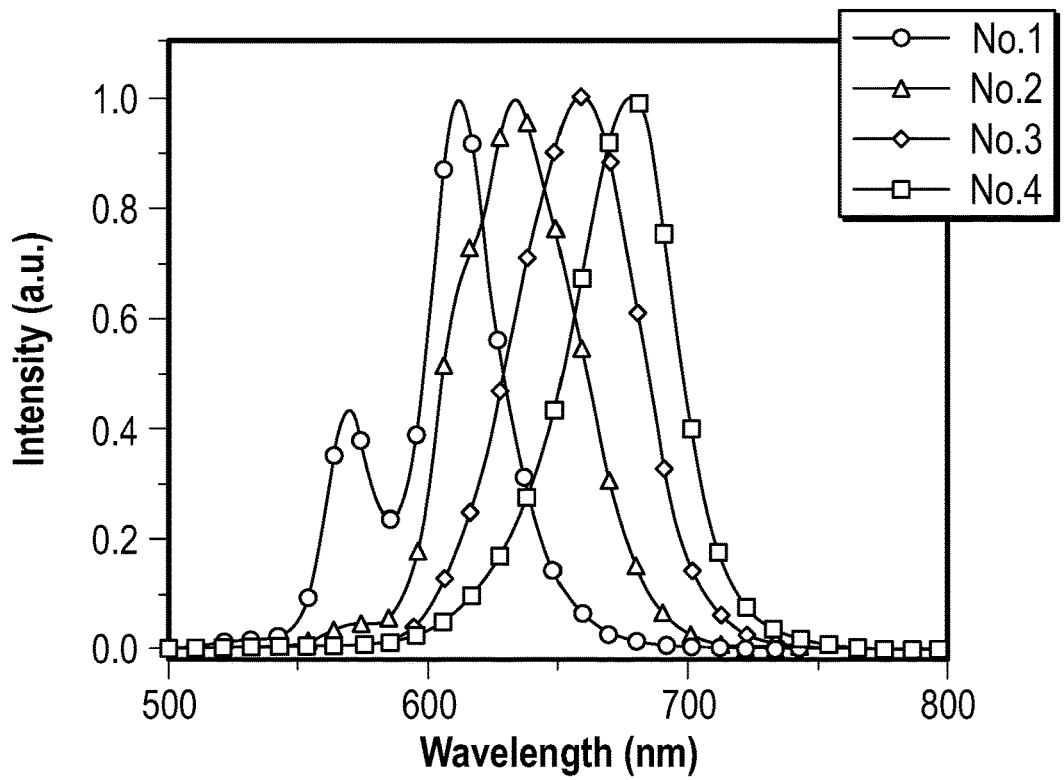
FIG. 7 depicts photoluminescence spectra of embodiments of quasi-2D perovskite/PEO composite films.
Figure 8:
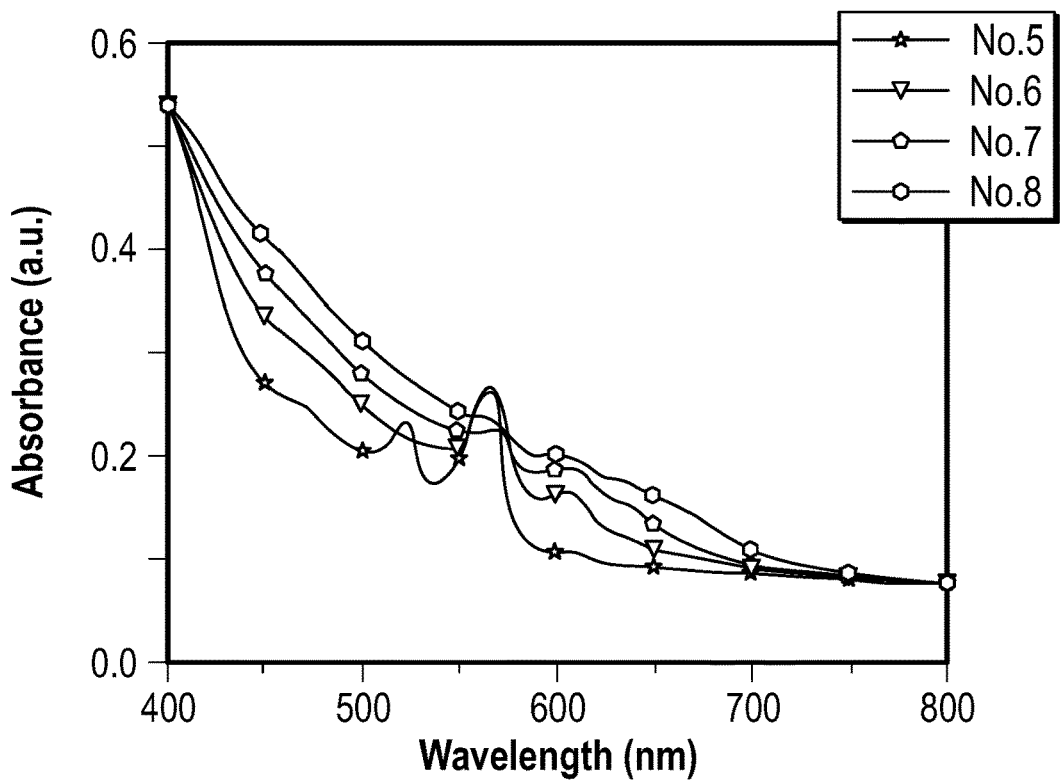
FIG. 8 depicts absorption spectra of embodiments of control quasi-2D perovskite films without PEO.
Figure 9:
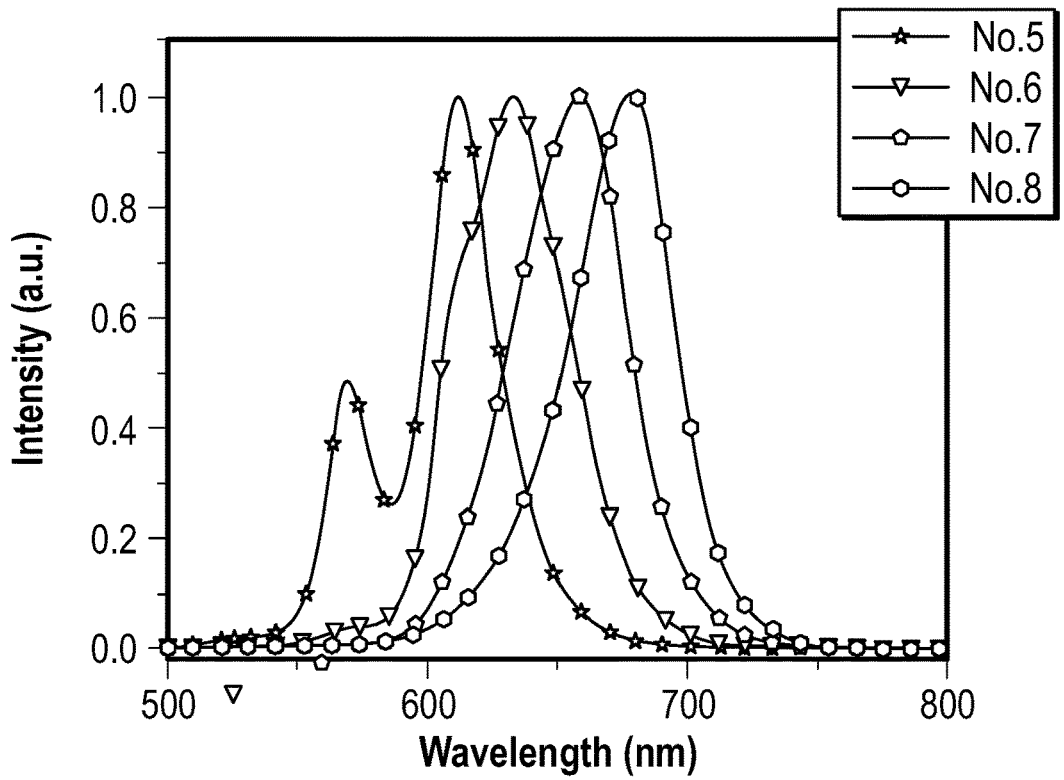
FIG. 9 depicts photoluminescence spectra of embodiments of control quasi-2D perovskite films without PEO.

The synthetic control of the thickness of cesium lead iodide quantum well structures by manipulating the molar ratio of the large organic salt (BAI) and inorganic salts (CsI and $PbI_2$) resulted in precise color tuning from red (peaked @ 615 nm) to deep-red (peaked @ 676 nm), as shown at FIG. 7. The decreasing of band gap upon the increasing of n from No. 1 to No. 4 is clearly shown. The absorption and PL data together revealed energy transfer from larger band gap to small band gap quasi 2D perovskites. For sample Nos. 5 to 8 without PEO, almost identical film absorption and emission spectral shapes were recorded, as depicted at FIG. 8 and FIG. 9.

Figure 10A:
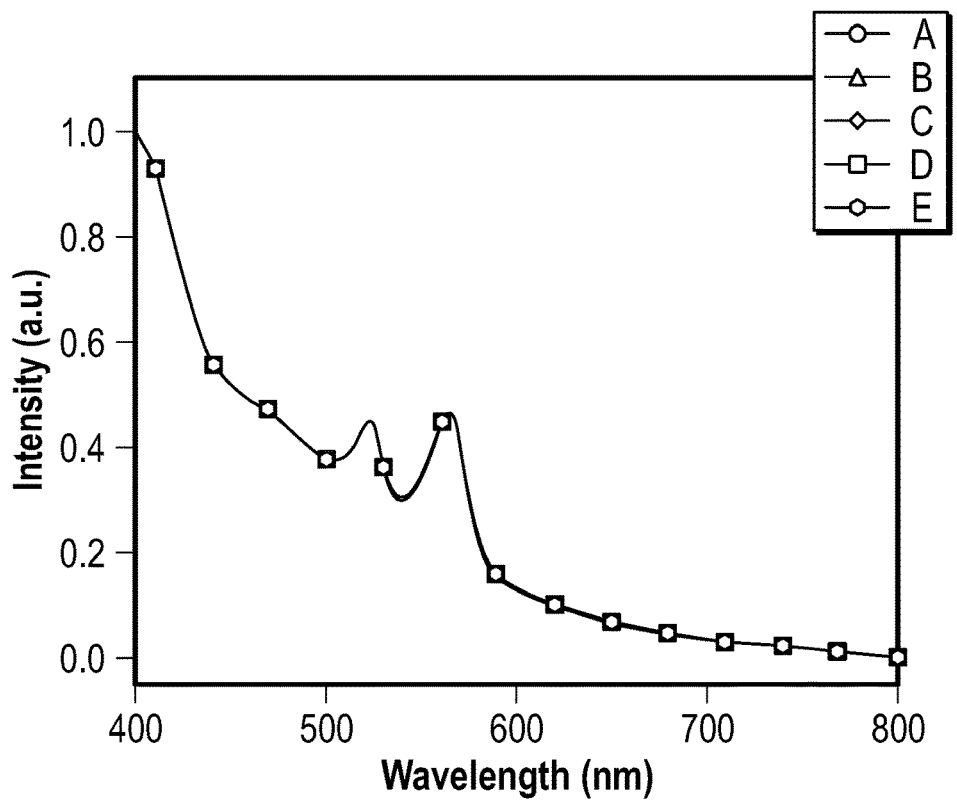
FIG. 10A through FIG. 10H depict UV-Vis absorption spectra collected at different locations of films, including embodiments of quasi-2D perovskite/PEO composite films (FIG. 10A, FIG. 10B, FIG. 10C, and FIG. 10D), and embodiments of control quasi-2D perovskite films without PEO (FIG. 10E, FIG. 10F, FIG. 10G, and FIG. 10F).
Figure 10B:
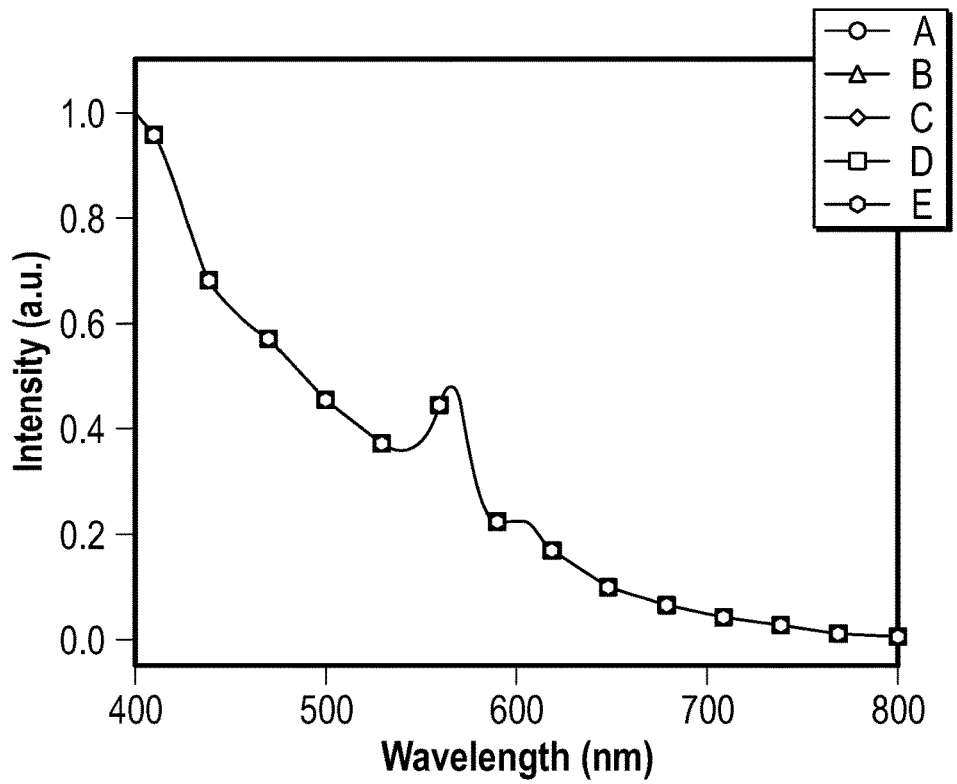
Figure 10C:
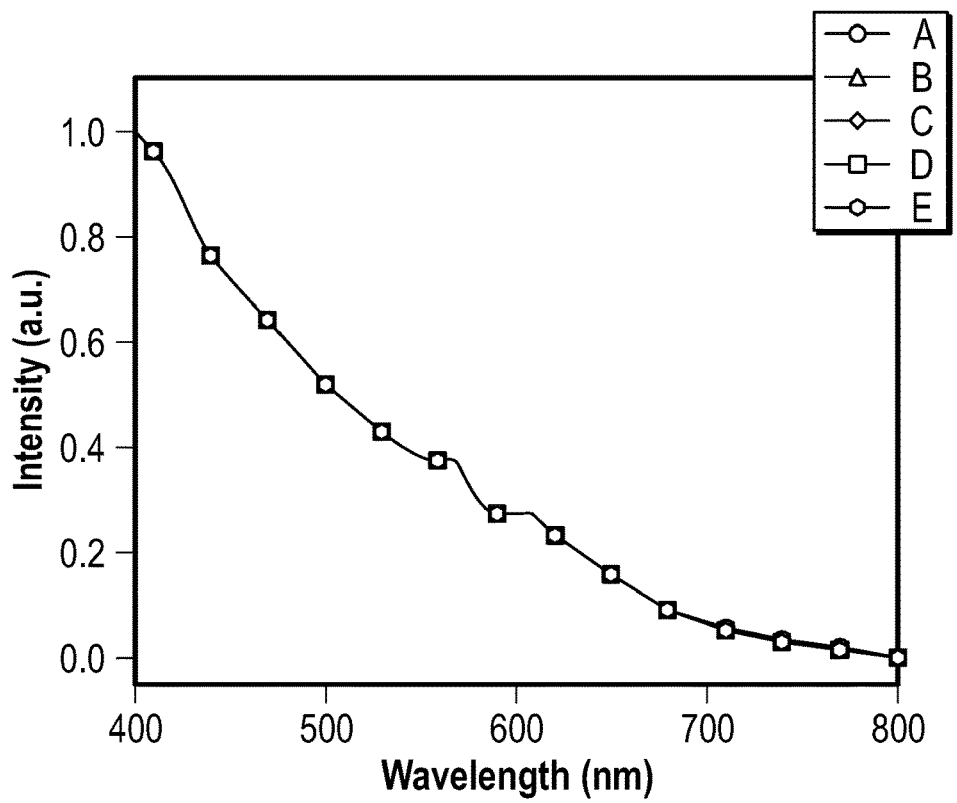
Figure 10D:
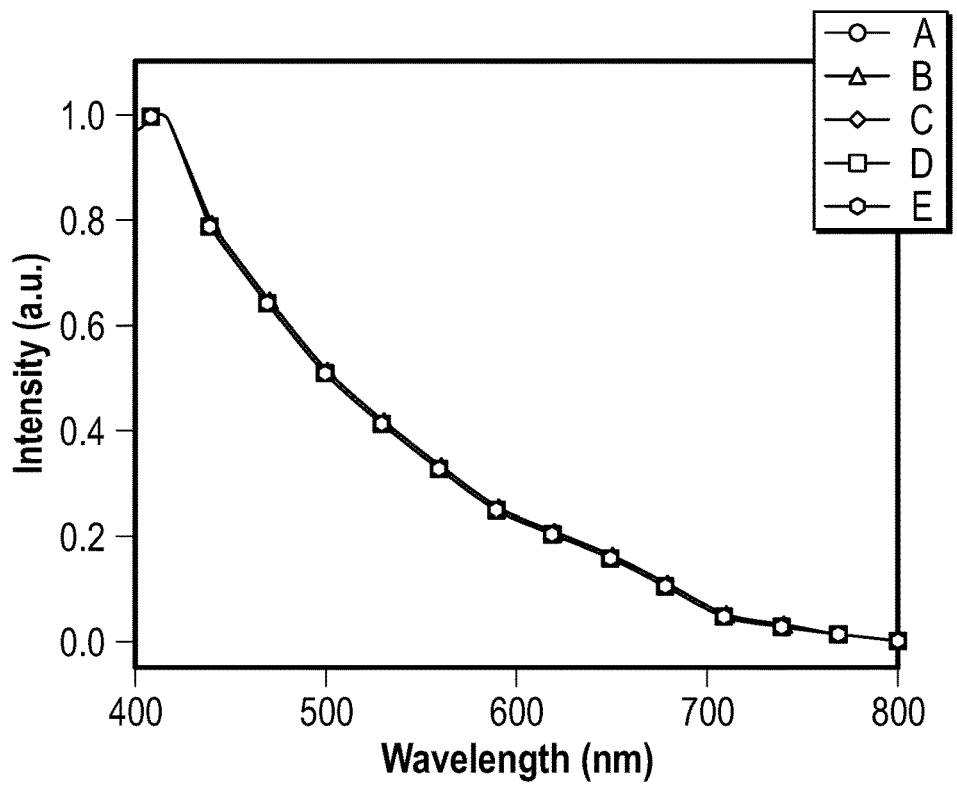
Figure 10E:
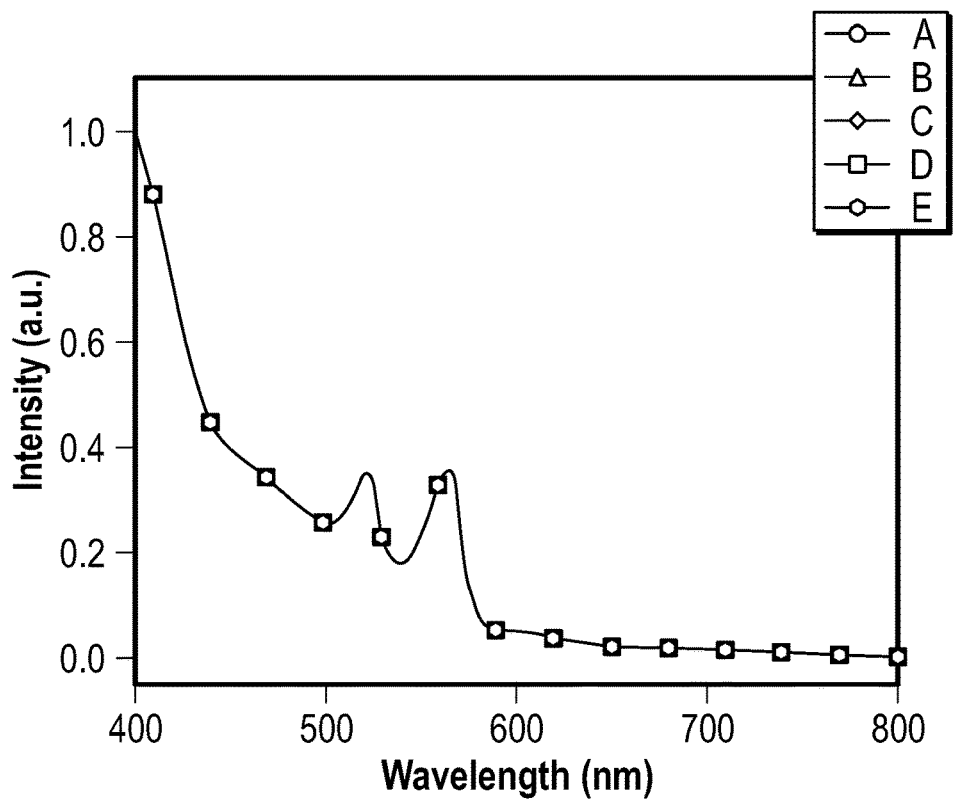
Figure 10F:
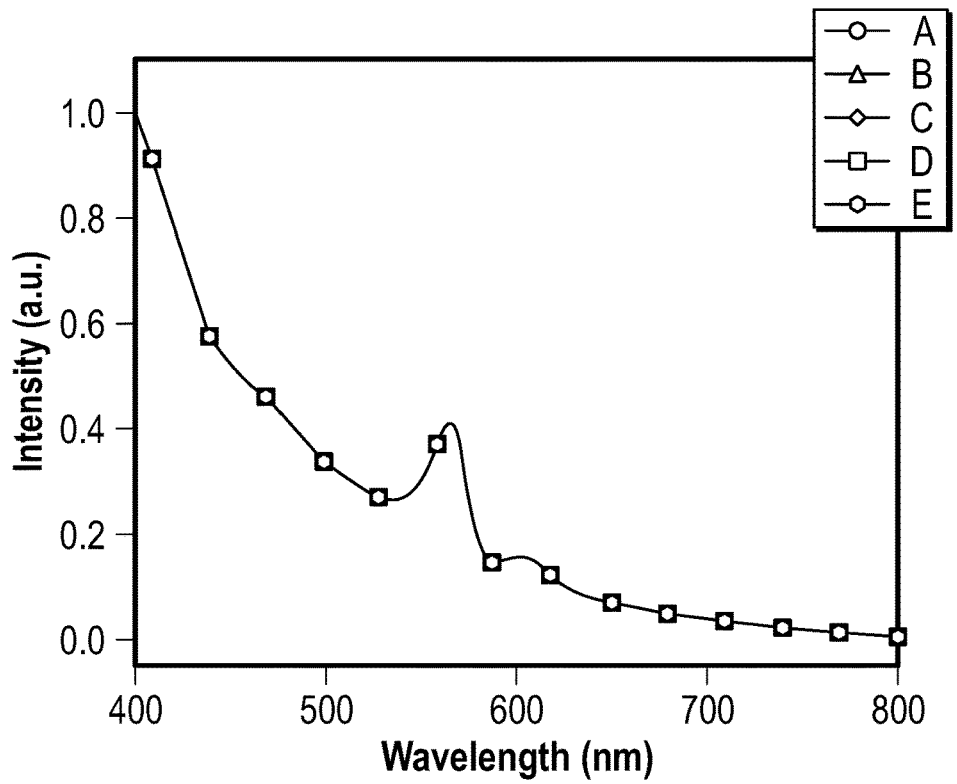
Figure 10G:
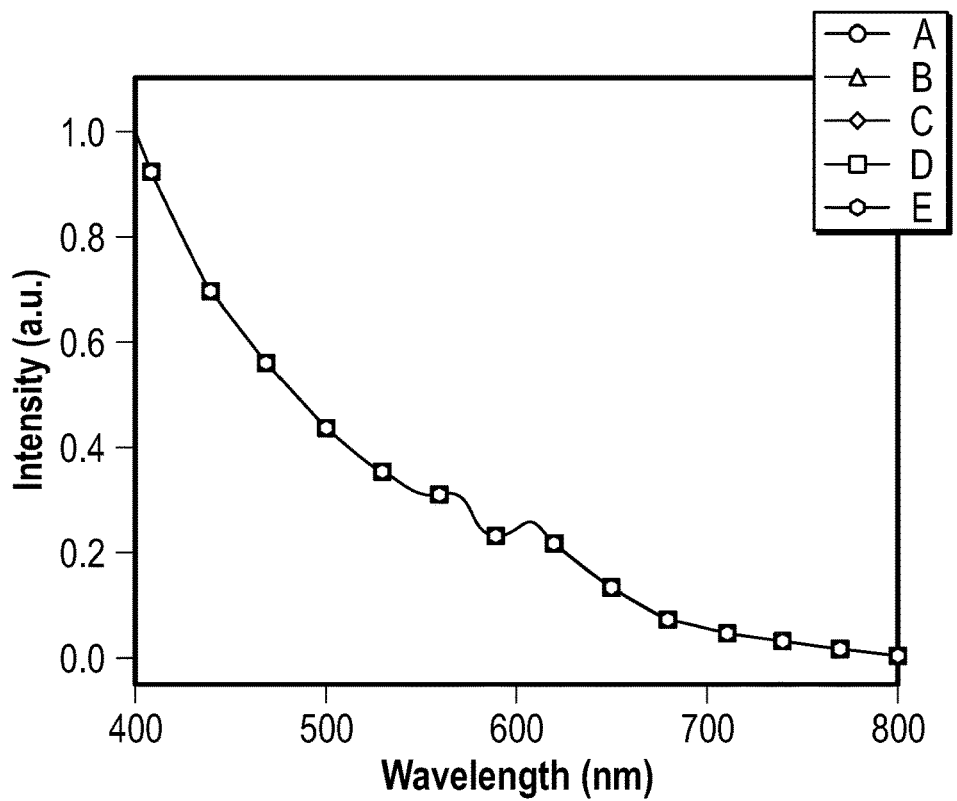
Figure 10H:
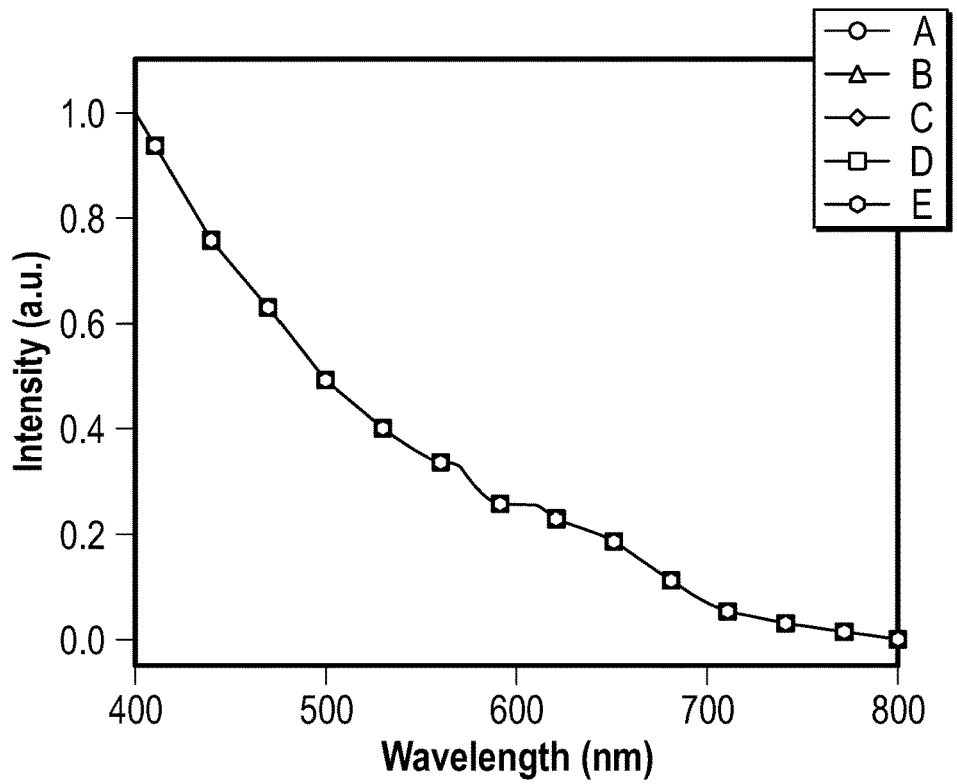
Figure 11A:
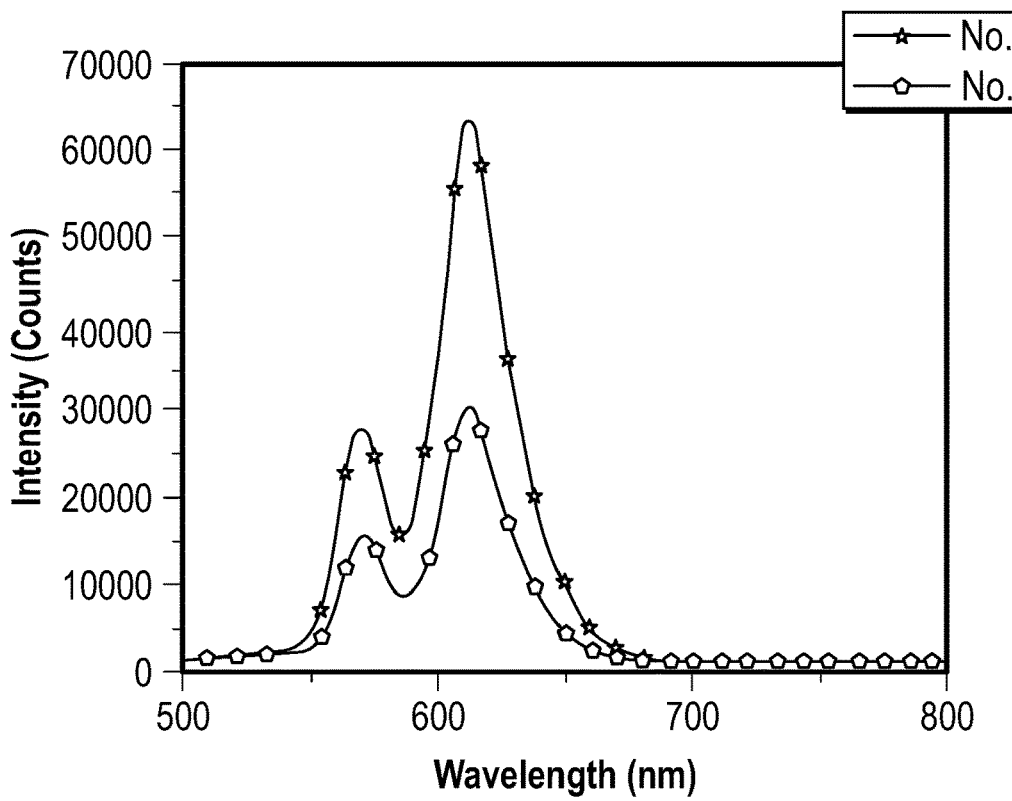
FIG. 11A, FIG. 11B, FIG. 11C, and FIG. 11D depict comparisons of the photoluminescence emission intensities of embodiments of quasi-2D perovskite/PEO composite films and embodiments of control quasi-2D perovskite films without PEO.
Figure 11B:
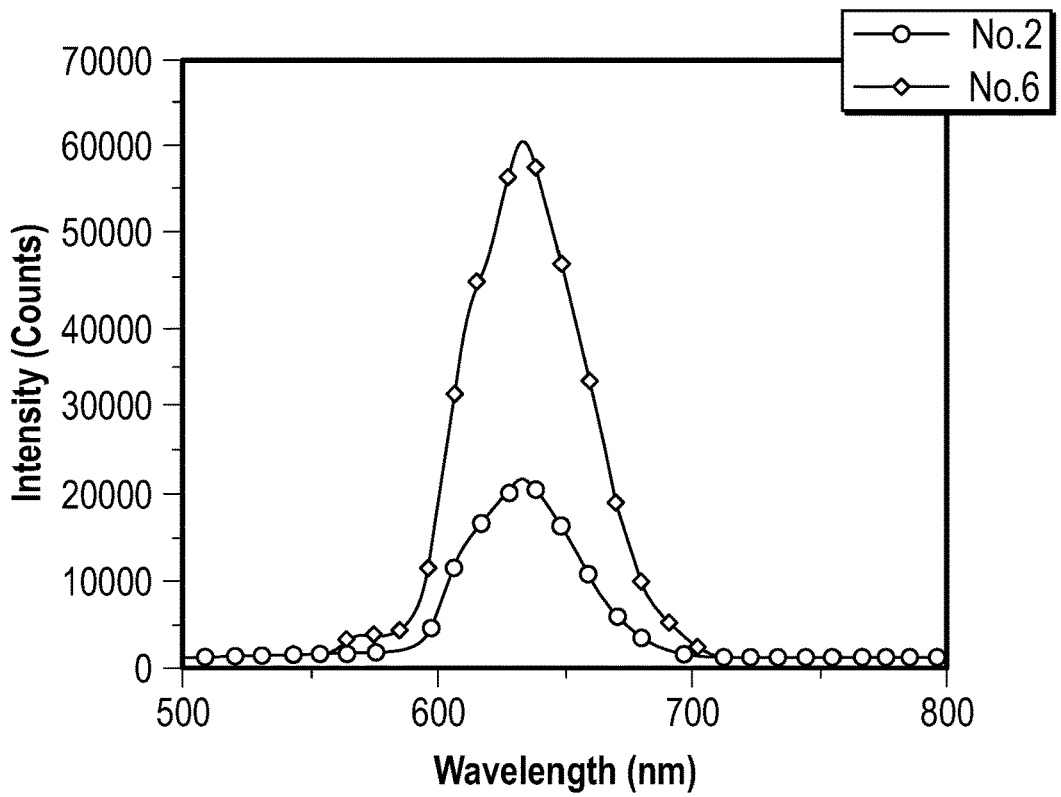
Figure 11C:
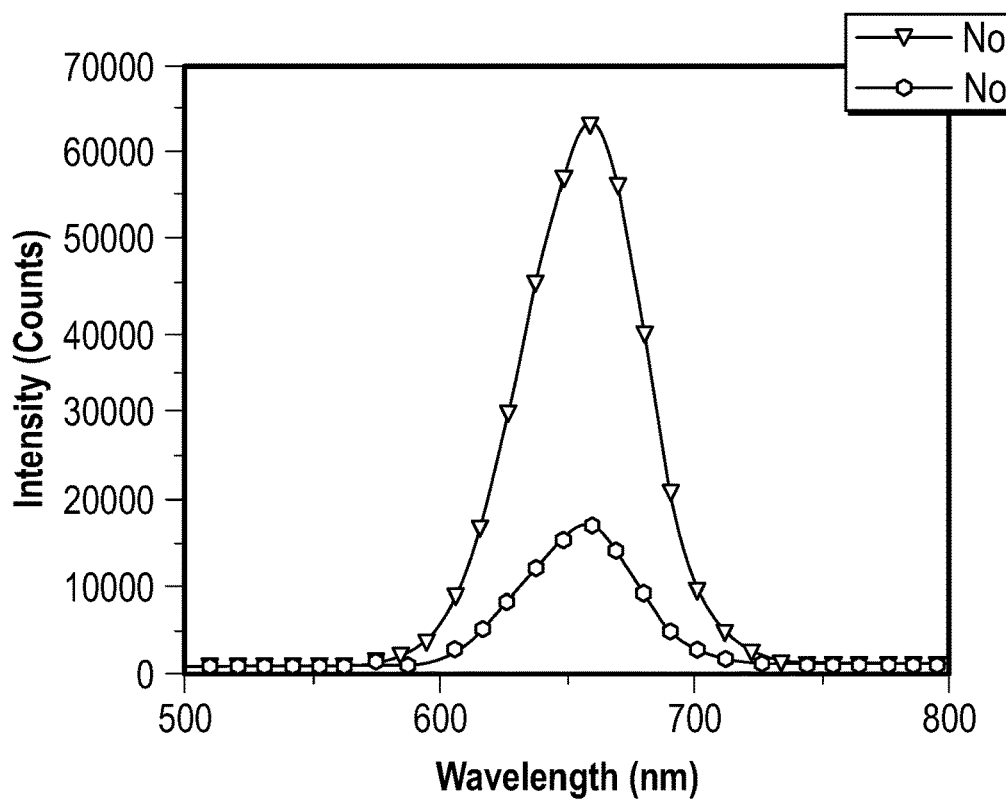
Figure 11D:
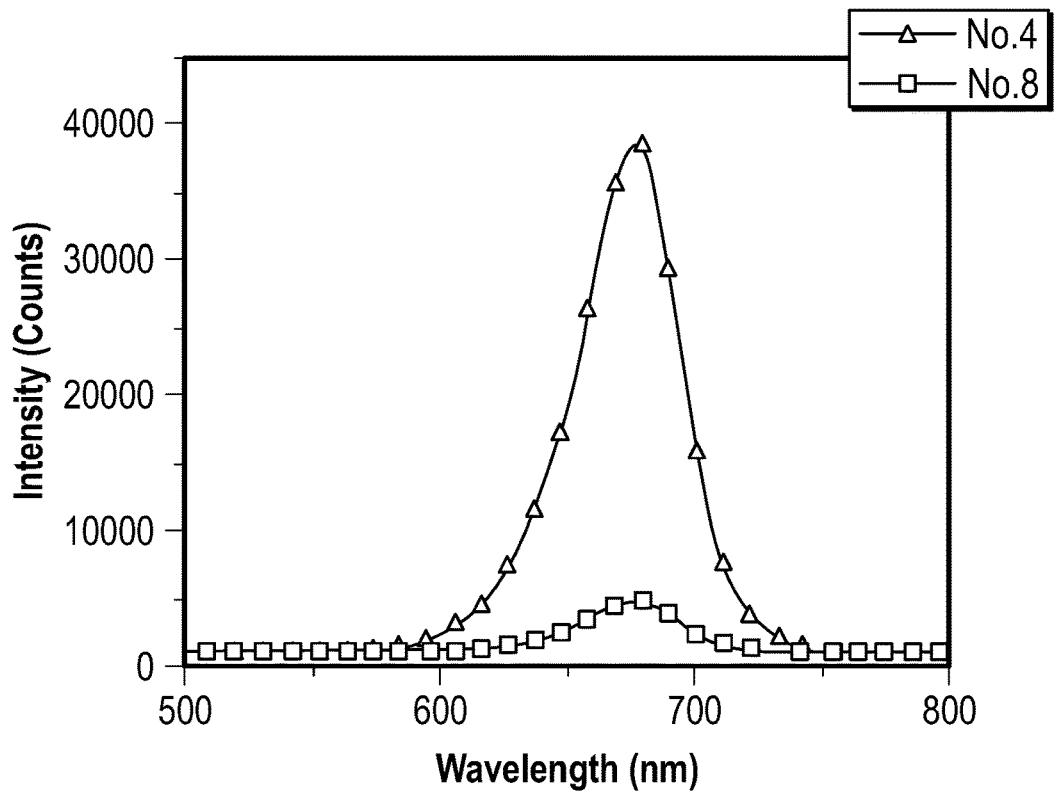

In order to prove the uniformity of films at a millimter scale, absorption spectra was measured at different random spots for film Nos. 1 to 8, as shown at FIG. 10A (No. 1), FIG. 10B (No. 2), FIG. 10C (No. 3), FIG. 10D (No. 4), FIG. 10E (No. 5), FIG. 10F (No. 6), FIG. 10G (No. 7), and FIG. 10F (No. 8) (A, B, C, D and E represent five random spots on each film).

The quasi-2D perovskite/PEO composite films exhibited much higher photoluminescence efficiencies than their neat quasi-2D perovskite counterparts (FIG. 11A, FIG. 11B, FIG. 11C, FIG. 11D, and FIG. 12), which could be attributed to the surface passivation and formation of small emitting crystals in the composite films that significantly reduced the non-radiative decay pathways.

FIG. 11A, FIG. 11B, FIG. 11C, and FIG. 11D depict comparisons of the photoluminescence emission intensities of films No. 1 and No. 5, No. 2 and No. 6, No. 3 and No. 5, and No. 4 and No. 8, respectively.

Figure 12:
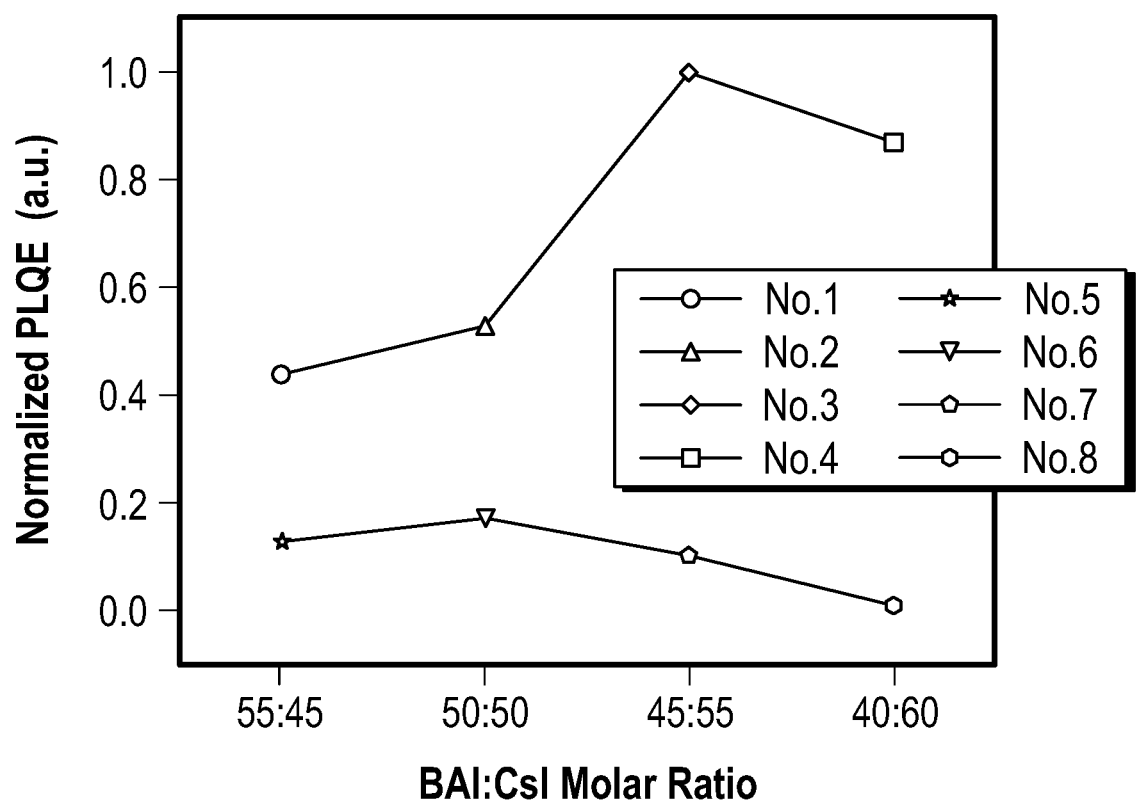
FIG. 12 depicts a plot of normalized photoluminescence quantum efficiencies (PLQEs) for embodiments of perovskite films.

FIG. 12 depicts a comparison of normalized PLQEs of the No. 1 to No. 4 films, and the No. 5 to No. 8 films.

The quasi-2D perovskite/PEO composite films showed much longer PL lifetimes than their neat quasi-2D perovskites counterparts.

Figure 13A:
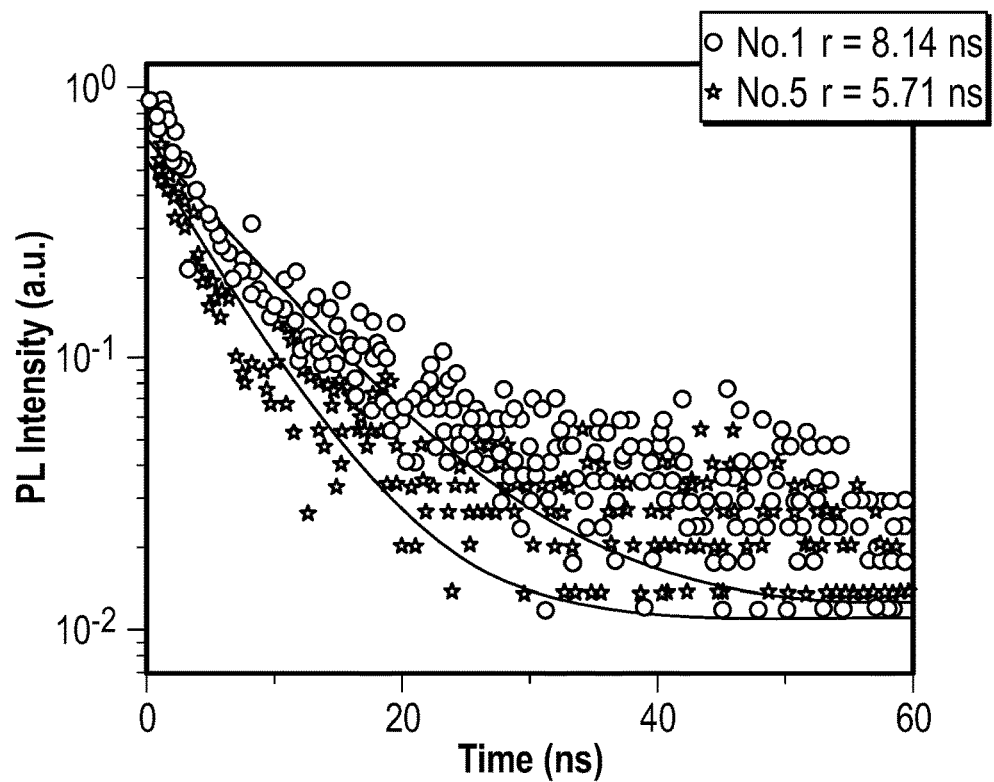
FIG. 13A, FIG. 13B, FIG. 13C, and FIG. 13D depict time-resolved photoluminescence spectra of embodiments of quasi-2D perovskite/PEO composite films and embodiments of control quasi-2D perovskite films without PEO.
Figure 13B:
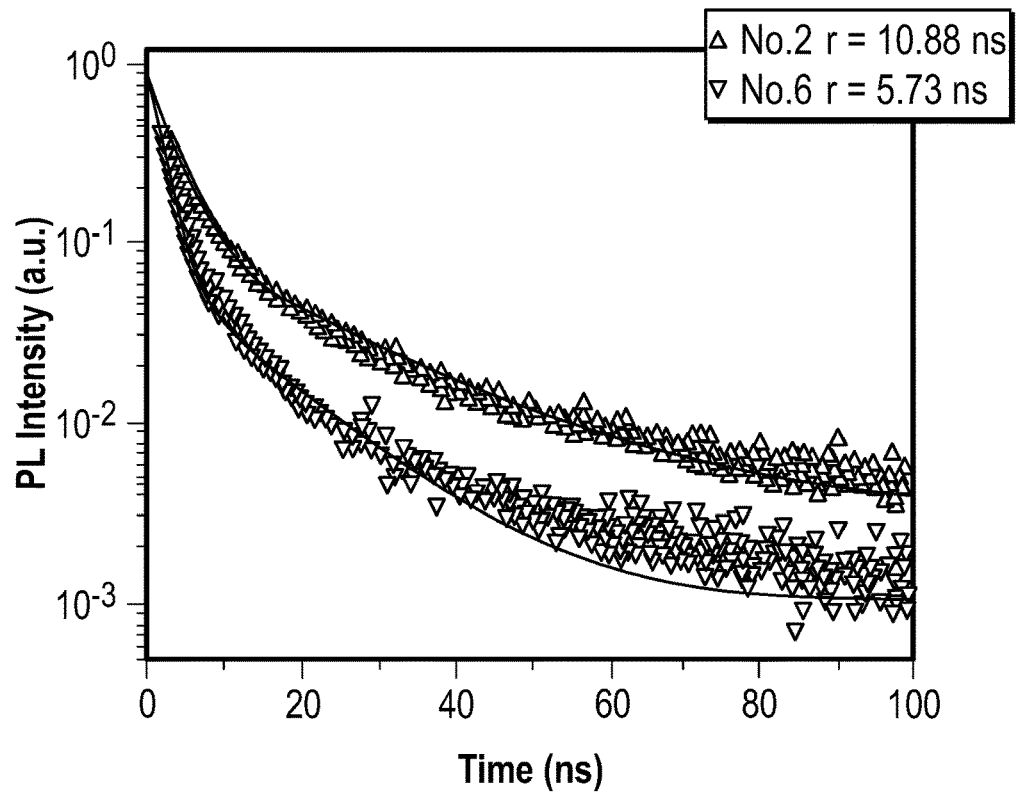
Figure 13C:
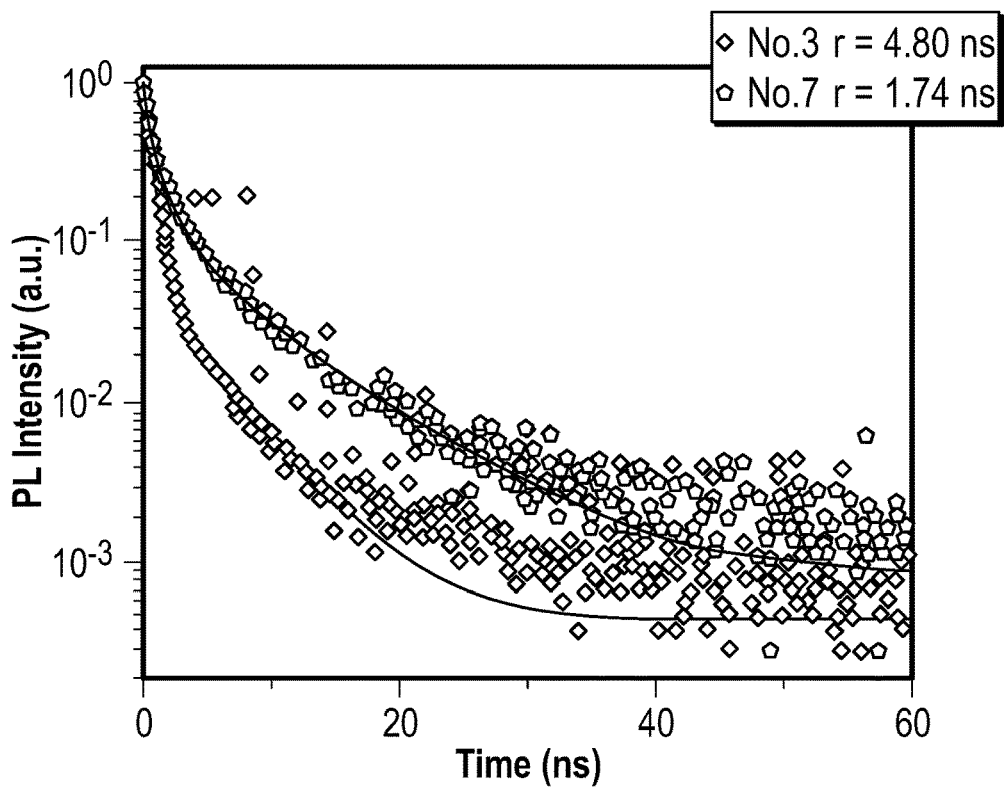
Figure 13D:
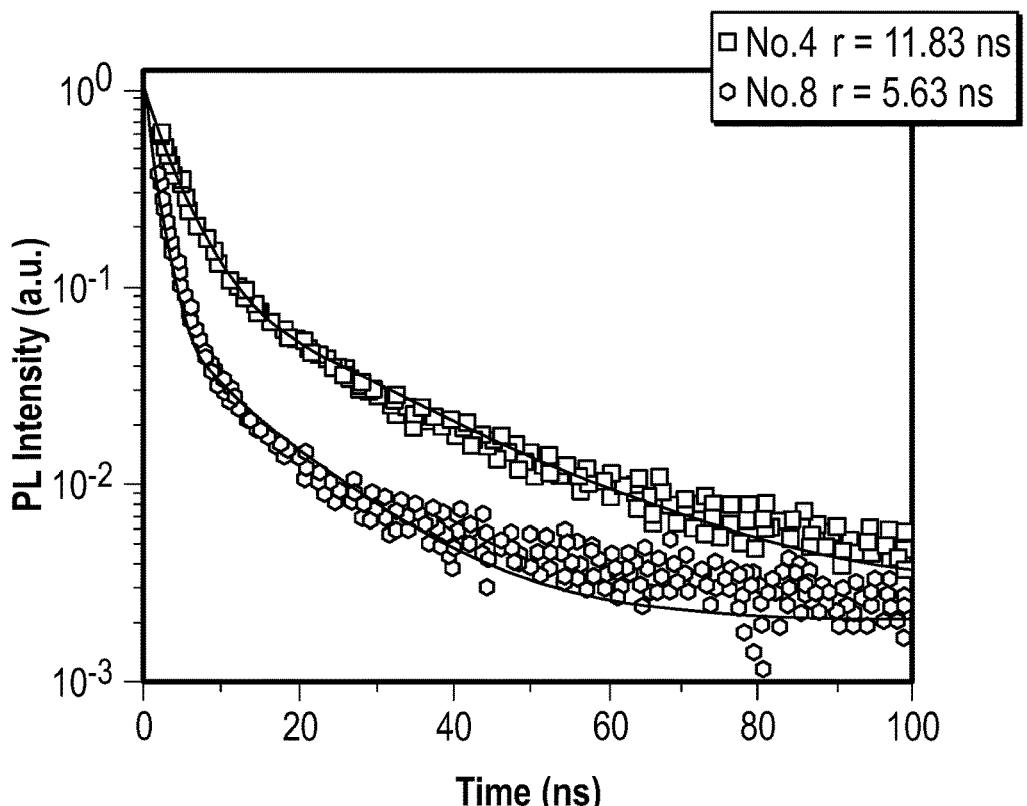

FIG. 13A, FIG. 13B, FIG. 13C, and FIG. 13D depict time-resolved photoluminescence spectra (with a trendline fit to the data) of films No. 1 and No. 5 (FIG. 13A); No. 2 and No. 6 (FIG. 13B); No. 3 and No. 7 (FIG. 13C); and No. 4 and No. 8 (FIG. 13D).

The optical and morphological properties of the quasi-2D cesium lead iodide perovskite/PEO films of this example suggested their potential application for electroluminescent devices.

Example 2—Device Fabrication

ITO-coated glass substrates were cleaned by successive sonication in a soap solution, deionized water, acetone, and isopropanol for 15 min at 40° C., and UV ozone-cleaned for 20 mins.

PEDOT:PSS was spun-cast onto the cleaned ITO coated glass substrate at 8000 rpm for 45 s, and baked at 140° C. for 20 min to obtain a 40 nm thick film.

Poly-TPD in chlorobenzene with a concentration of 8 mg/mL was spun-cast at 3000 rpm for 60 s, following by thermal annealing at 130° C. for 20 min to obtain a 20 nm thickness.

The poly-TPD films were treated by $O_2$ plasma for 2 s to improve wetting properties.

After that, a 0.35M quasi 2D perovskite/PEO mixture precursor solution was spin coated on the top at 8000 rpm for 60 s.

After spin coating, a heat treatment was performed at 70° C. for 20 mins. The final thickness was about 50 nm.

A 40 nm thick layer of TPBi was then deposited at a rate of 1.0 Å/s under high vacuum (<3×10−6 Torr). After the deposition of TPBi, the chamber was vented, and a shadow mask with a 2 mm wide stripe was placed onto the substrates perpendicular to the ITO stripes. 1 nm LiF and 100 nm Al were deposited at a rate of 0.02 Å/s and 4 Å/s, respectively. OLEDs were formed at the 2×2 mm squares where the ITO (anode) and Al (cathode) stripes intersected.

Figure 14:
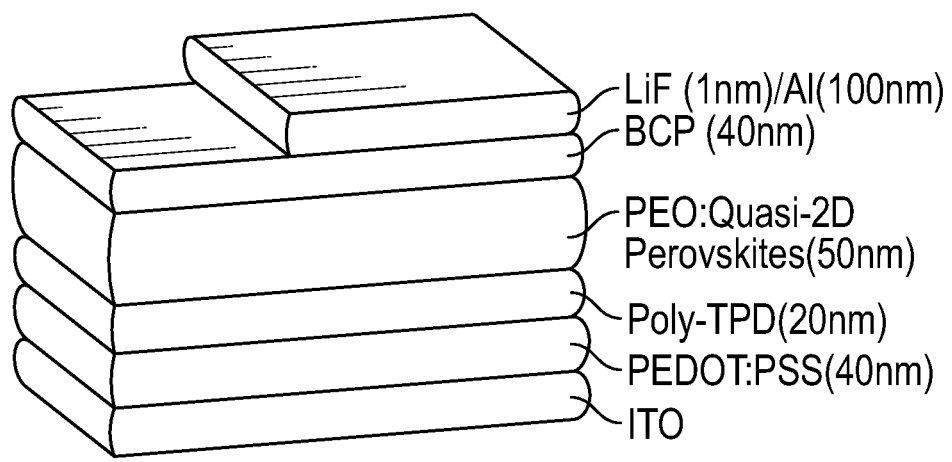
FIG. 14 is a schematic of an embodiment of a light-emitting diode device.

Using the films of Example 1 as light-emitting layers (EL), a series of electrically driven LEDs were fabricated with the same device structure, ITO/PEDOT:PSS(40 nm)/poly-TPD(20 nm)/EL(50 nm)/TPBi(40 nm)/LiF(1 nm)/Al (100 nm), in which PEDOT:PSS was a hole injecting layer, poly-TPD was a hole transport/electron blocking layer, and TPBi was an electron transport layer, as shown at FIG. 14.

Surface characterizations of each layer in the devices were conducted by collecting AFM images of each layer in perovskite LEDs devices. For device No. 3, the following data was collected ($R_q$ is root mean square roughness): a) TPBi ($R_q$=1.26 nm); b) PEO:Quasi-2D perovskites ($R_q$=2.06 nm); c) Poly-TPD ($R_q$=0.57 nm); d) PEDOT:PSS ($R_q$=0.71 nm).

Figure 15A:
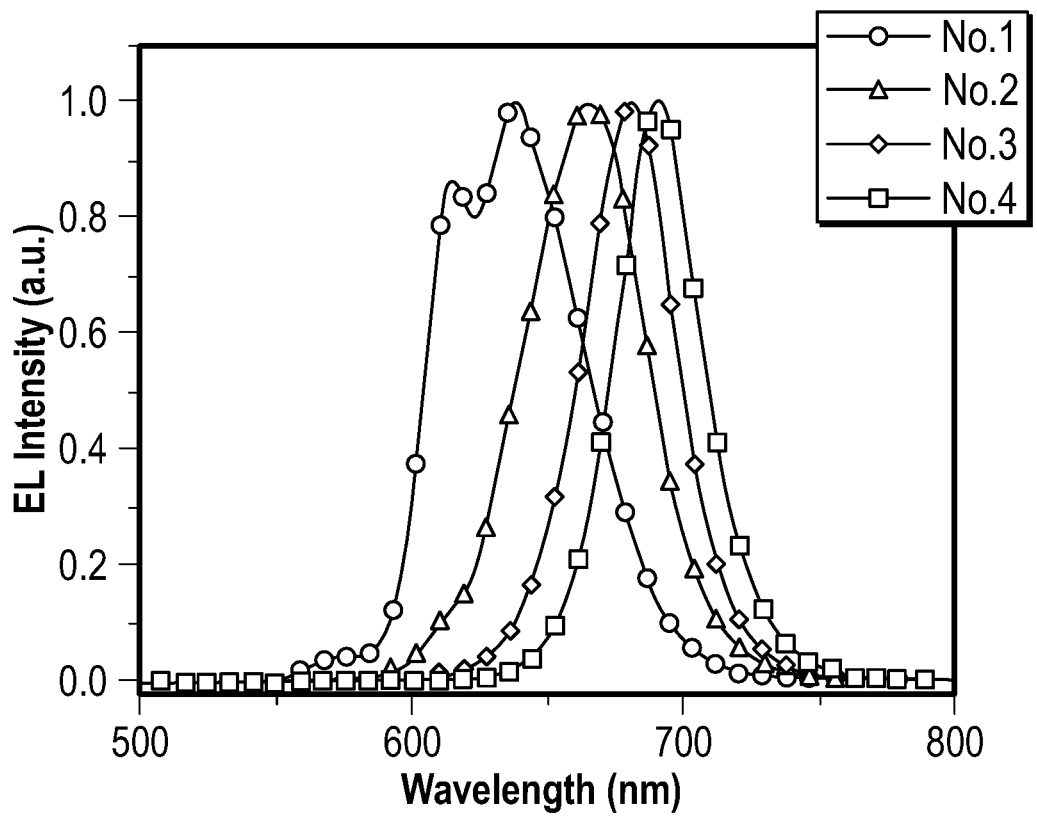
FIG. 15A, FIG. 15B, and FIG. 15C depict plots of electroluminescence spectra (FIG. 15A), current density versus voltage (I-V curves) (FIG. 15B), brightness versus voltage (FIG. 15B), and external quantum efficiencies (EQEs) versus current density (FIG. 15C) for embodiments of light-emitting diode devices.
Figure 15B:
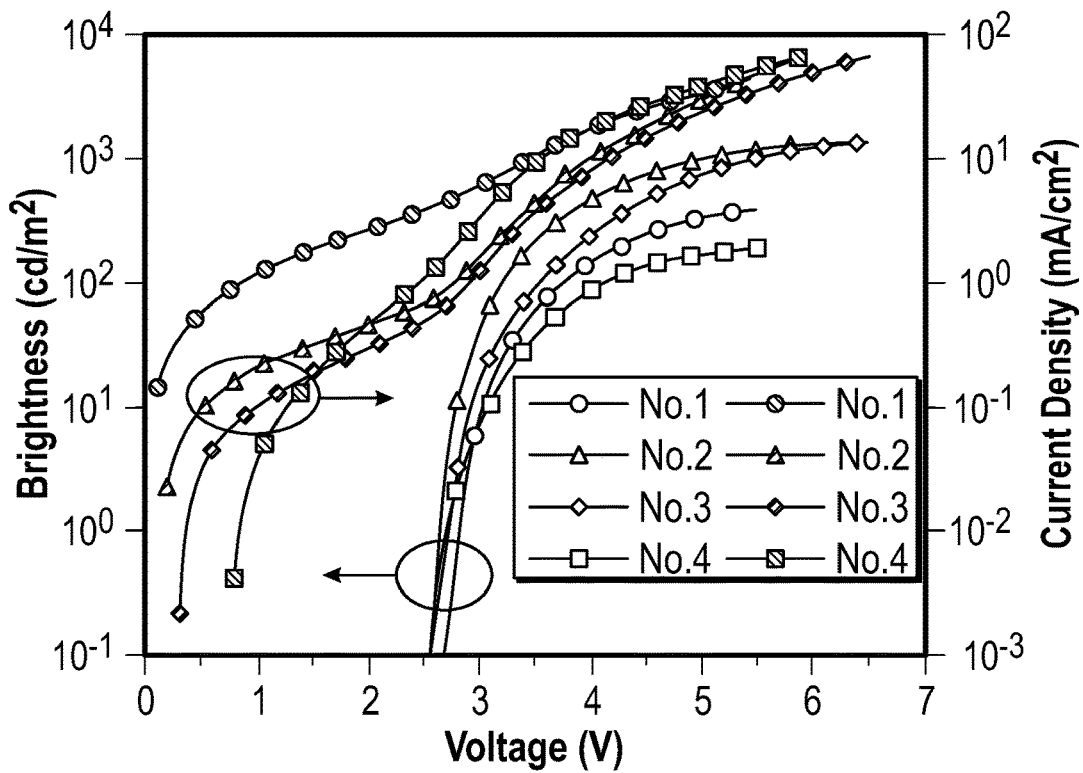
Figure 15C:
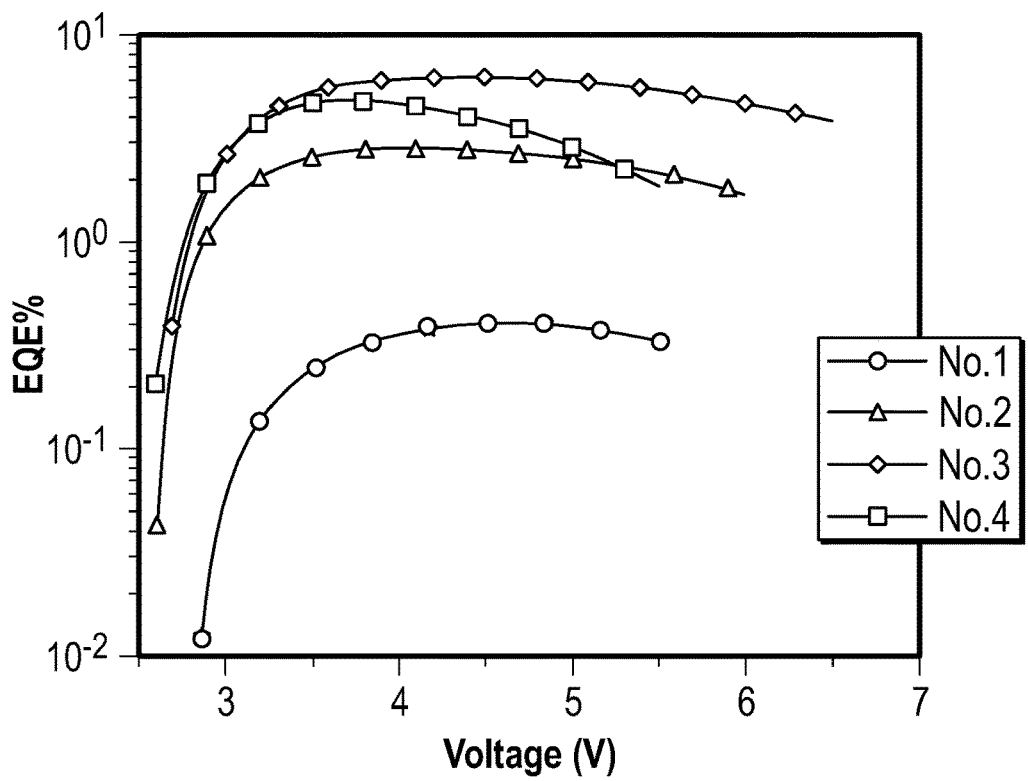

More device characteristics are depicted at FIG. 15A, FIG. 15B, and FIG. 15C, including electroluminescence spectra (FIG. 15A), current density versus voltage (I-V curves) (FIG. 15B), brightness versus voltage (FIG. 15B), and EQEs versus current density (FIG. 15C) for the LEDs with quasi-2D perovskite/PEO composite films as the emitting layer.

Figure 16A:
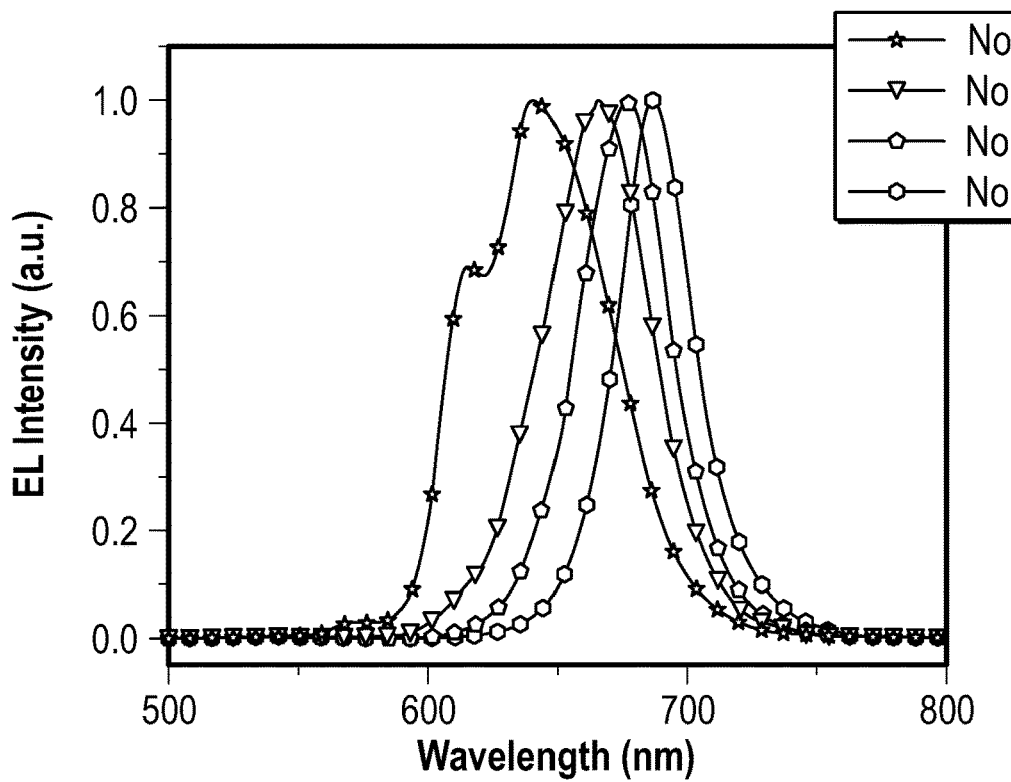
FIG. 16A, FIG. 16B, FIG. 16C, and FIG. 16D depict an EL spectrum, current density vs. voltage curves, brightness vs. voltage curves, and a plot of EQE % vs. voltage for embodiments of control devices.
Figure 16B:
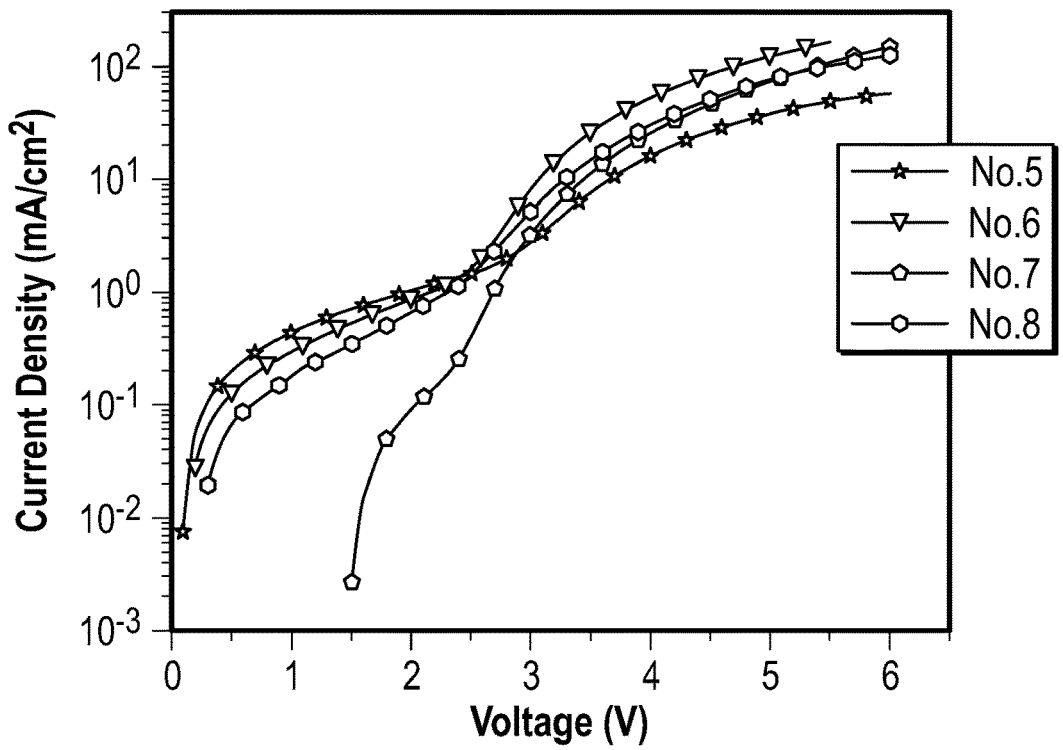
Figure 16C:
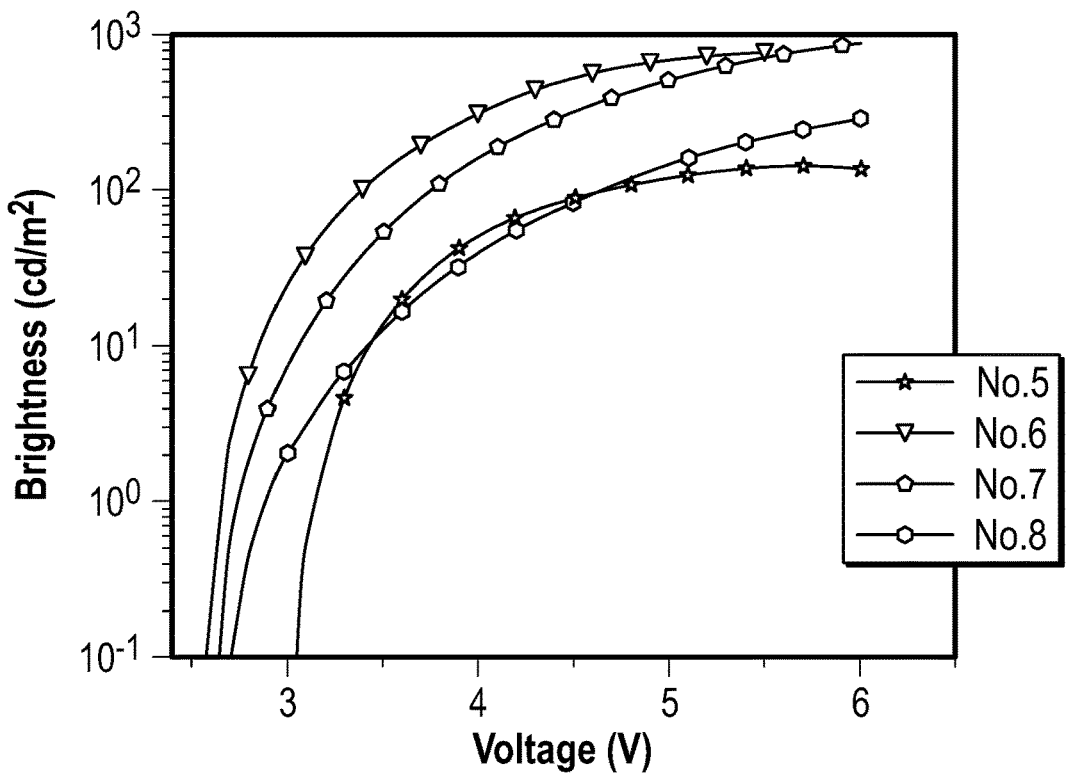
Figure 16D:
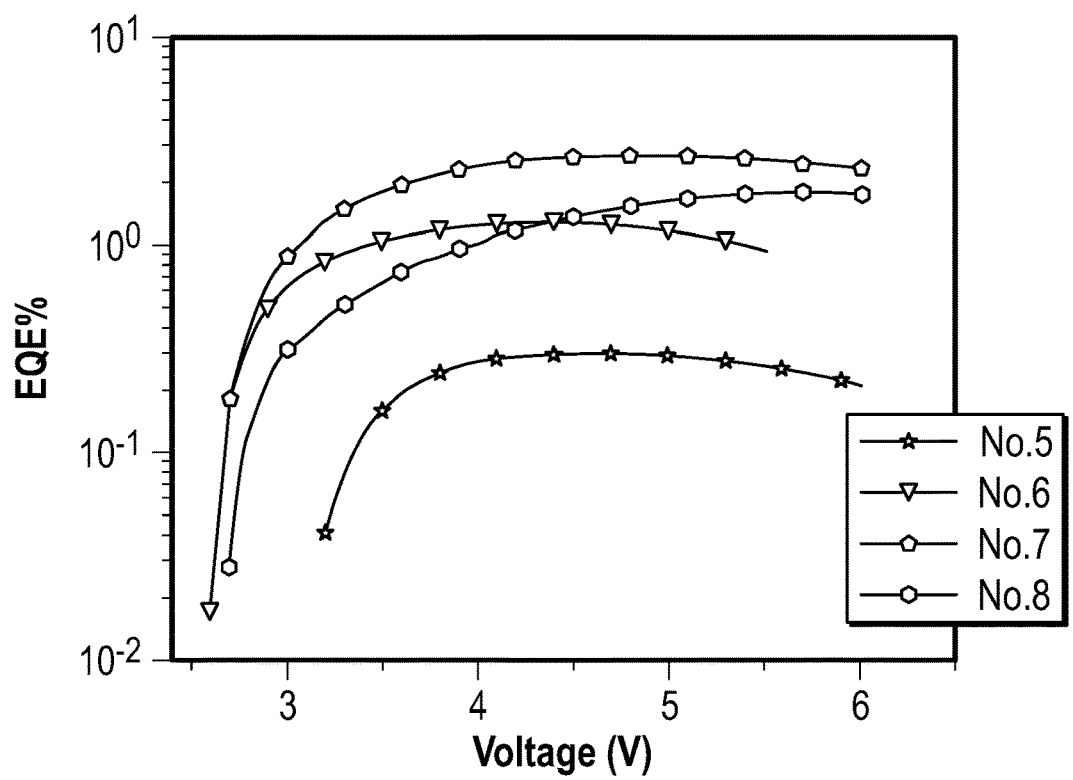

Control devices based on neat quasi-2D perovskites films were also fabricated and tested, with the results shown at FIG. 16A, FIG. 16B, FIG. 16C, and FIG. 16D. FIG. 16A depicts an EL spectrum of devices No. 5, No. 6, No. 7, and No. 8. FIG. 16B depicts current density vs. voltage curves for devices No. 5, No. 6, No. 7, and No. 8. FIG. 16C depicts brightness vs. voltage curves for devices No. 5, No. 6, No. 7, and No. 8. FIG. 16D depicts EQE % vs. voltage for devices No. 5, No. 6, No. 7, and No. 8.

The devices based on composite films exhibited significantly better performance than their neat perovskite film counterparts, which likely was due to their better film morphologies and higher photoluminescence quantum efficiencies. Similar to the change of photoluminescence from red to deep-red for the composite films No. 1 to No. 4, the electroluminescence spectra had peaks from 638 nm to 664 nm, 680 nm, and 690 nm.

Except the device based on the composite film No. 1, which exhibited multiple peaks with a relatively high FWHM, all other devices had narrow emissions with FWHM as low as 36 nm. The Comission Internationale de l'Eclairage (CIE) chromaticity coordinates were calculated to be close to (0.67, 0.33), "ideal red" defined by the National Television System Committee (NTSC) for the display application. FIG. 15B shows the current densities and brightness of devices based on films No. 1 to No. 4 at different operating voltages. The maximum brightness of 1231 cd/m² and 1392 cd/m² for devices based on composite films No. 2 and No. 3, respectively, were believed to be the highest values achieved for red perovskites LED reported to date. Accordingly, a high value of EQEs of 6.23% was achieved for the device based on the composite film No. 3, as shown at FIG. 15C. These devices also showed high current and power efficiencies, as depicted at FIG. 17A, FIG. 17B, FIG. 17C, and FIG. 17D.

Figure 17A:
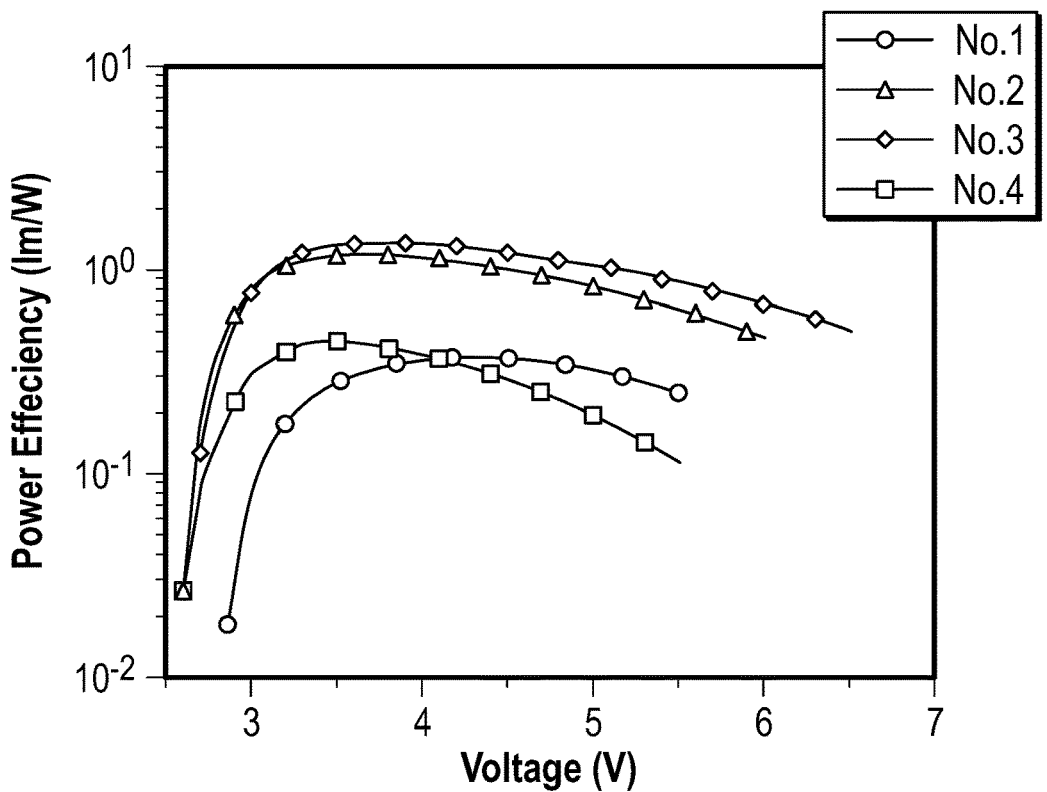
FIG. 17A, FIG. 17B, FIG. 17C, and FIG. 17D depict plots of the power efficiency vs. voltage and current efficiency vs. voltage for embodiments of devices.
Figure 17B:
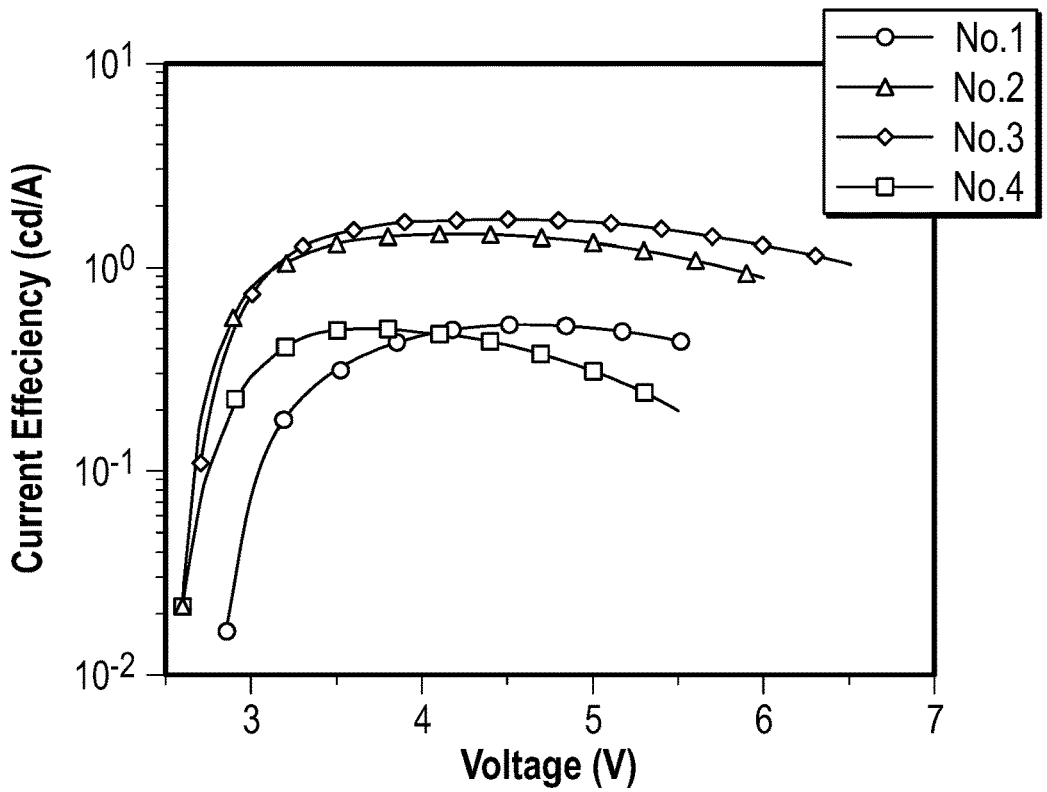
Figure 17C:
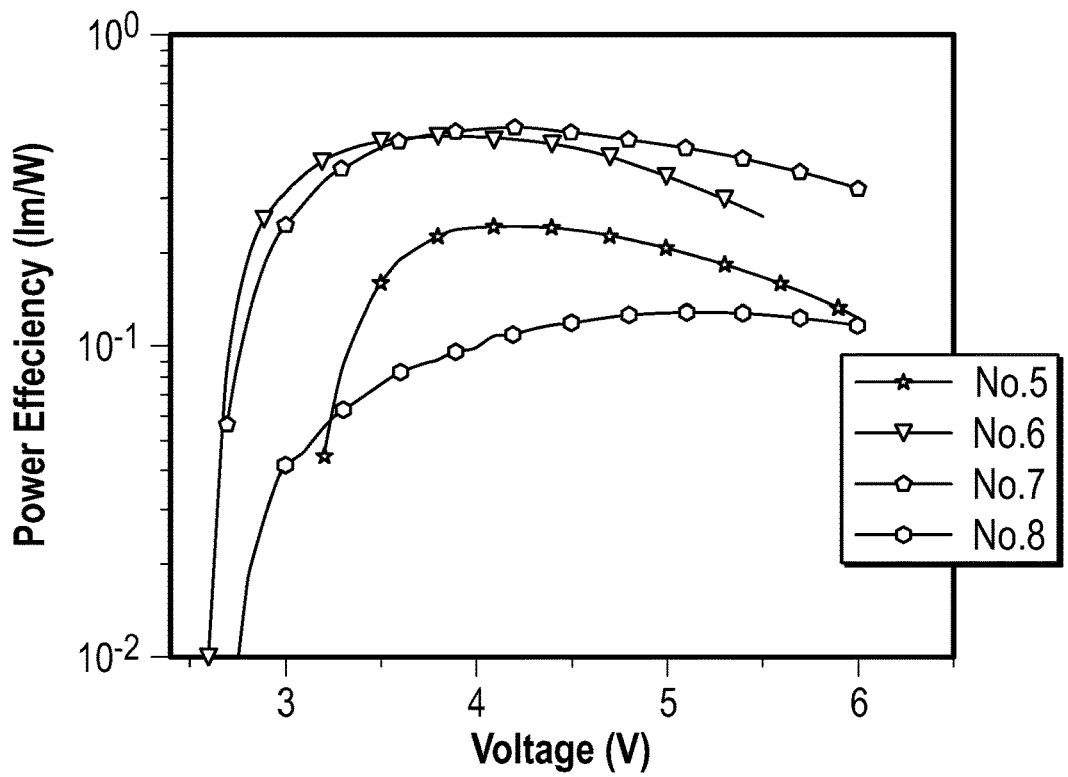
Figure 17D:
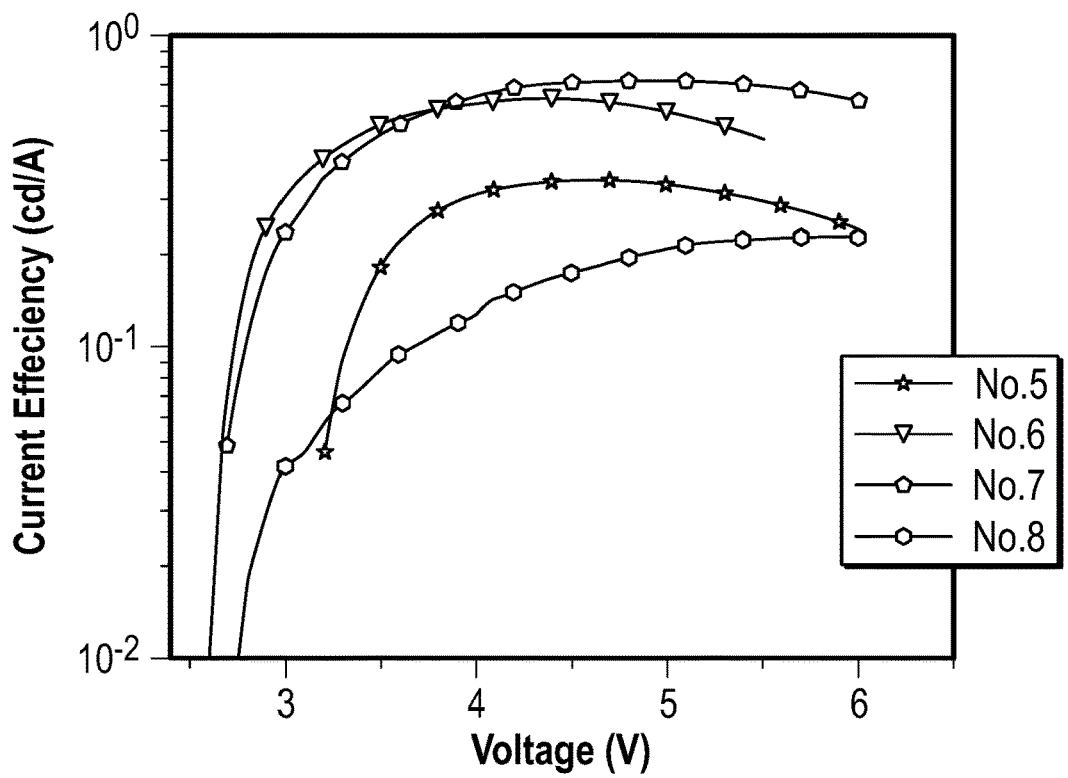

FIG. 17A and FIG. 17B depict the power efficiency vs. voltage (FIG. 17A), and current efficiency vs. voltage (FIG. 17B) for devices No. 1, No. 2, No. 3, and No. 4; and FIG. 17C and FIG. 17D depicts the power efficiency vs. voltage (FIG. 17C), and current efficiency vs. voltage (FIG. 17D) for devices No. 5, No. 6, No. 7, and No. 8.

All of the device performance data of this example are summarized in in the following table:

| | EL, nm | FWHM, nm | CIE, (x, y) | Max. Brightness, cd/m² | Max. EQE % | Max. Current Efficiency, cd/A | Max. Power Efficiency, lm/W |
|---|---|---|---|---|---|---|---|
| No. 1 | 638 | 61 | (0.67, 0.32) | 390 | 0.41% | 0.54 | 0.38 |
| No. 2 | 664 | 50 | (0.70, 0.29) | 1231 | 2.81% | 1.48 | 1.20 |
| No. 3 | 680 | 39 | (0.71, 0.28) | 1392 | 6.23% | 1.74 | 1.37 |
| No. 4 | 690 | 36 | (0.72, 0.27) | 186 | 4.73% | 0.51 | 0.45 |
| No. 5 | 640 | 67 | (0.68, 0.31) | 138 | 0.30% | 0.34 | 0.25 |
| No. 6 | 665 | 48 | (0.71, 0.29) | 776 | 1.30% | 0.62 | 0.47 |
| No. 7 | 676 | 40 | (0.72, 0.28) | 900 | 2.72% | 0.71 | 0.50 |
| No. 8 | 688 | 35 | (0.72, 0.27) | 290 | 1.80% | 0.22 | 0.13 |

Figure 18A:
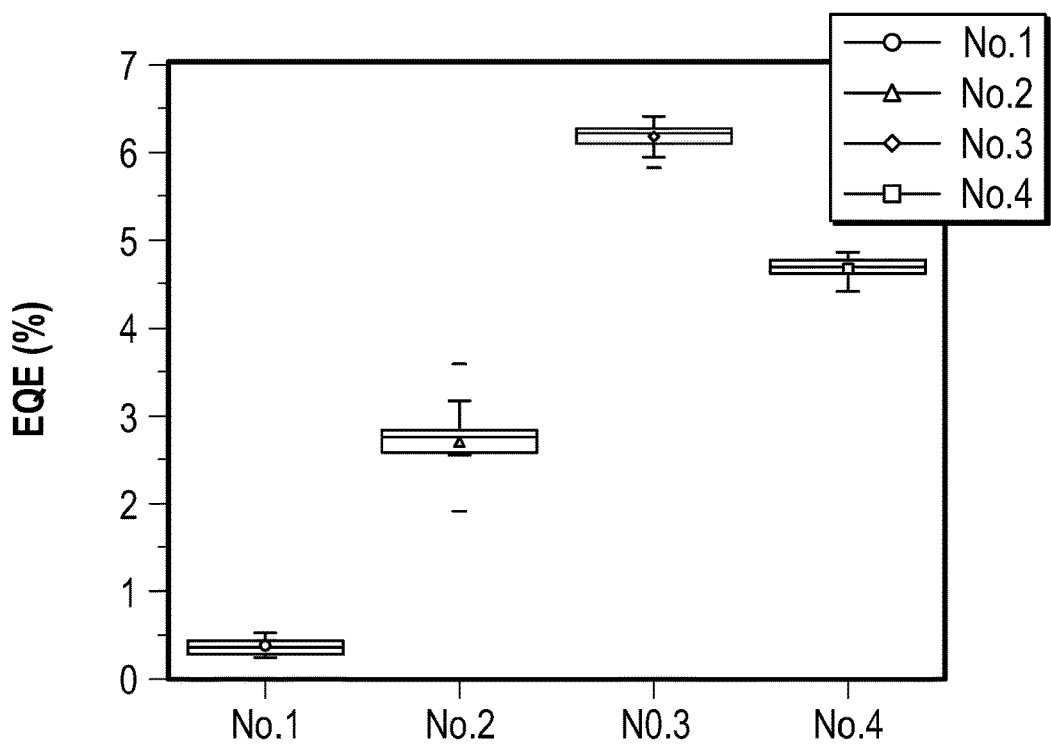
FIG. 18A and FIG. 18B depict the average maximum EQEs for embodiments of devices collected from different batches.
Figure 18B:
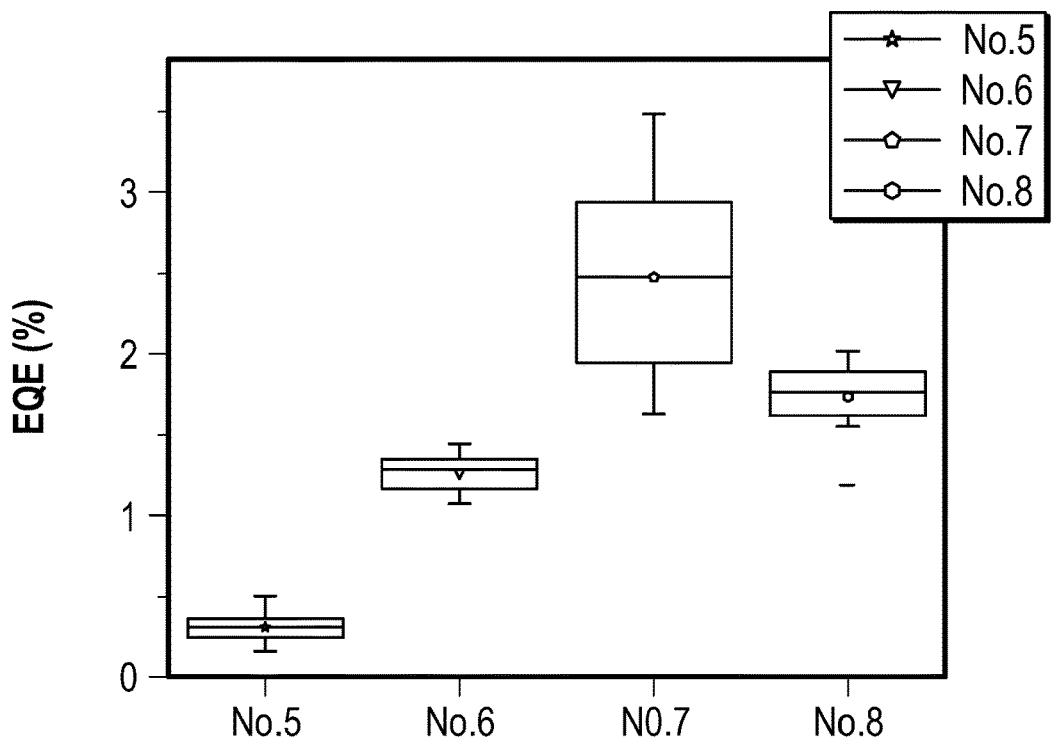

The average maximum EQEs for devices collected from different batches are shown at FIG. 18A and FIG. 18B. The average performance of maximum external quantum efficiency (EQE %) was measured from 80 devices, and FIG. 18A depicts the data from devices with PEO (No. 1, No. 2, No. 3 and No. 4), and FIG. 18B depicts the data from devices without PEO (No. 5, No. 6, No. 7 and No. 8). The solid squares show the average value. The boxes index the median and standard deviation. The whiskers point out the highest and lowest value.

Figure 19A:
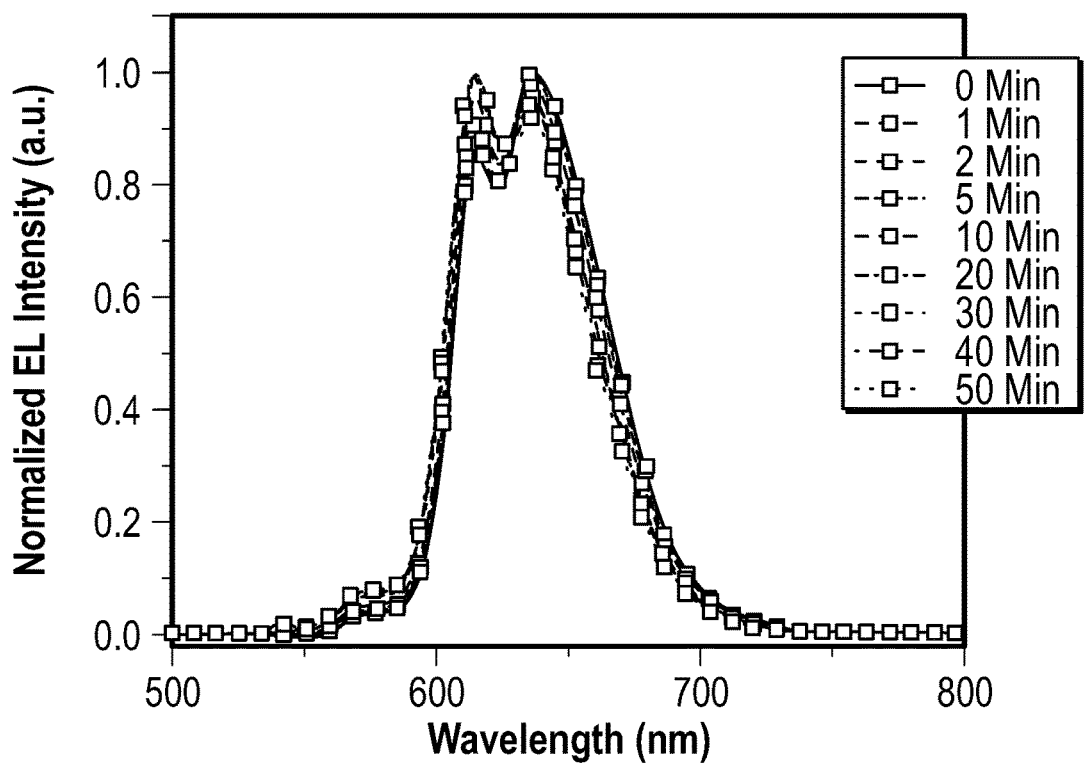
FIG. 19A, FIG. 19B, FIG. 19C, and FIG. 19D depict EL spectra of embodiments of devices operated at 3.5 V for up to 3.5 hours.
Figure 19B:
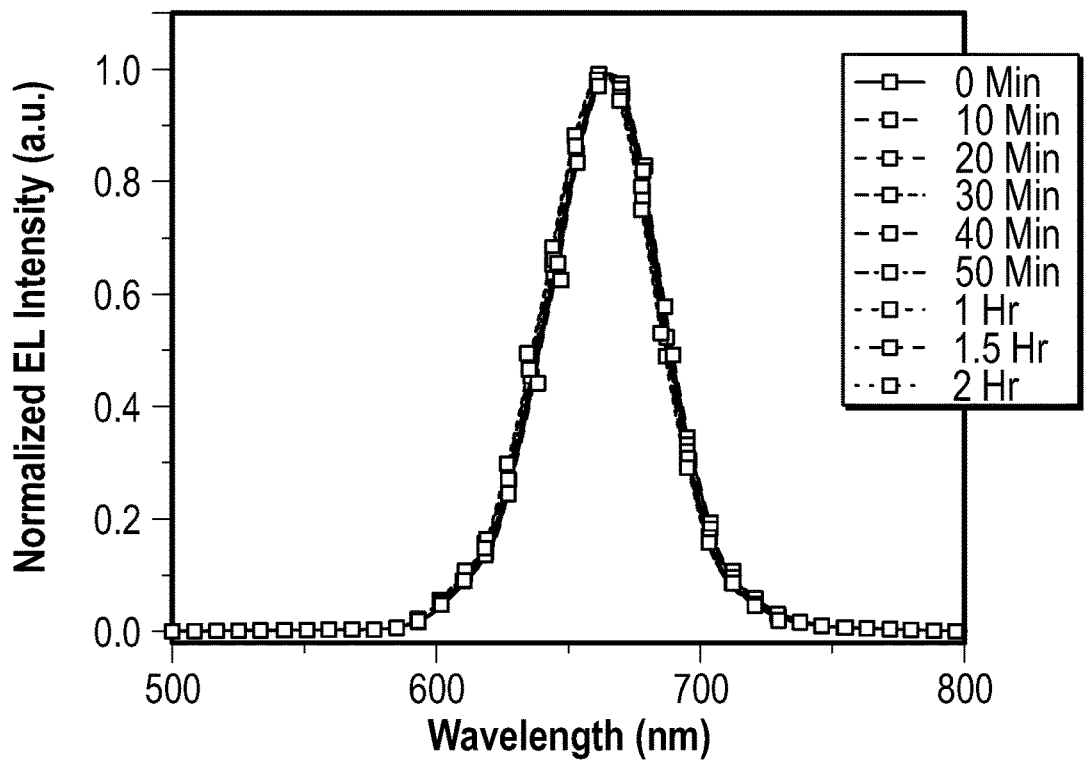
Figure 19C:
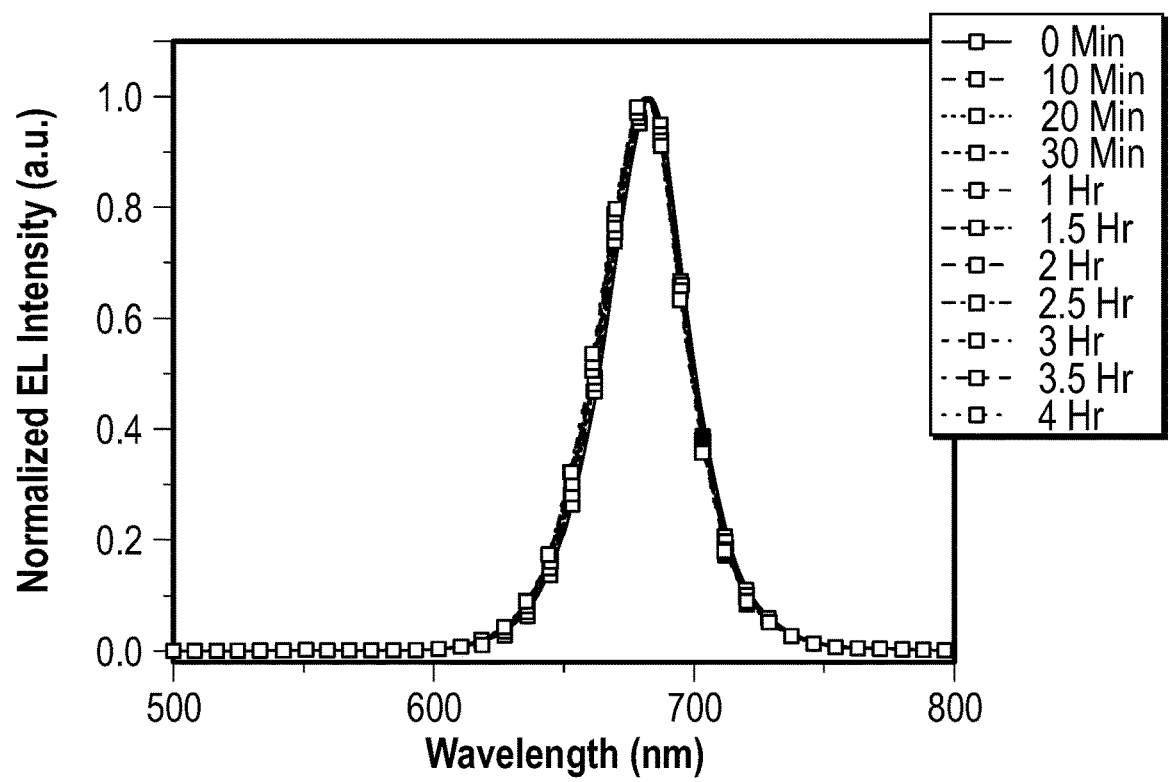
Figure 19D:
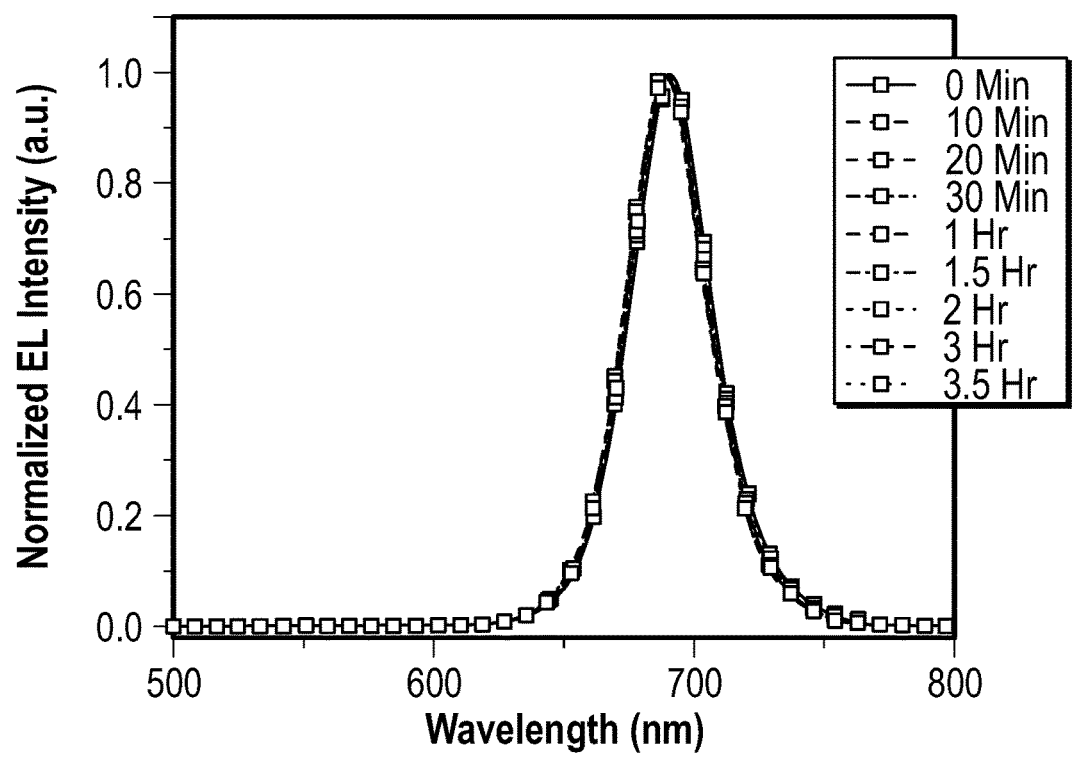

The perovskite LEDs based on quasi-2D perovskite/PEO composite films showed exceptional EL stability under device operation. As shown at FIG. 19A, FIG. 19B, FIG. 19C, and FIG. 19D, the EL spectra of all the devices remained almost identical under the operation at 3.5 V for a few hours. The electroluminescence spectrum stability under 3.5 V continuous voltage operation is depicted for device No. 1 (FIG. 19A), No. 2 (FIG. 19B); (c) No. 3 (FIG. 19C), and No. 4 (FIG. 19D).

Figure 20A:
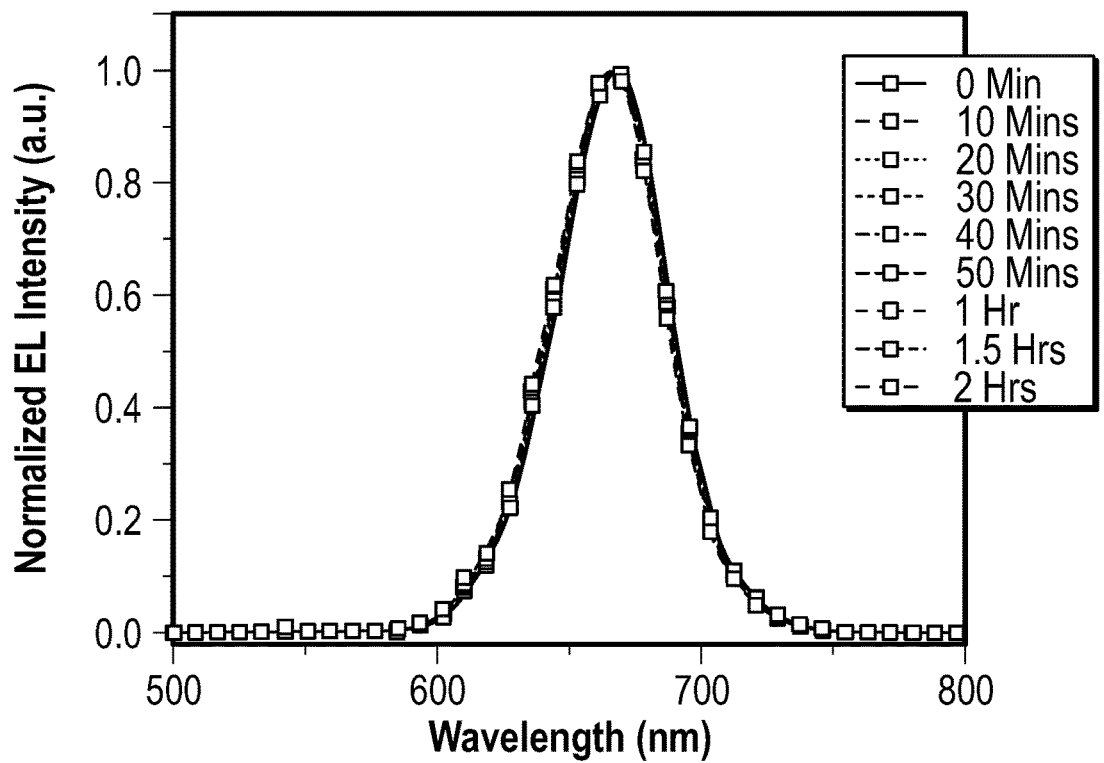
FIG. 20A and FIG. 20B depict the EL spectrum stability of an embodiment of a device at 4.5 V and 5.5 V, respectively.
Figure 20B:
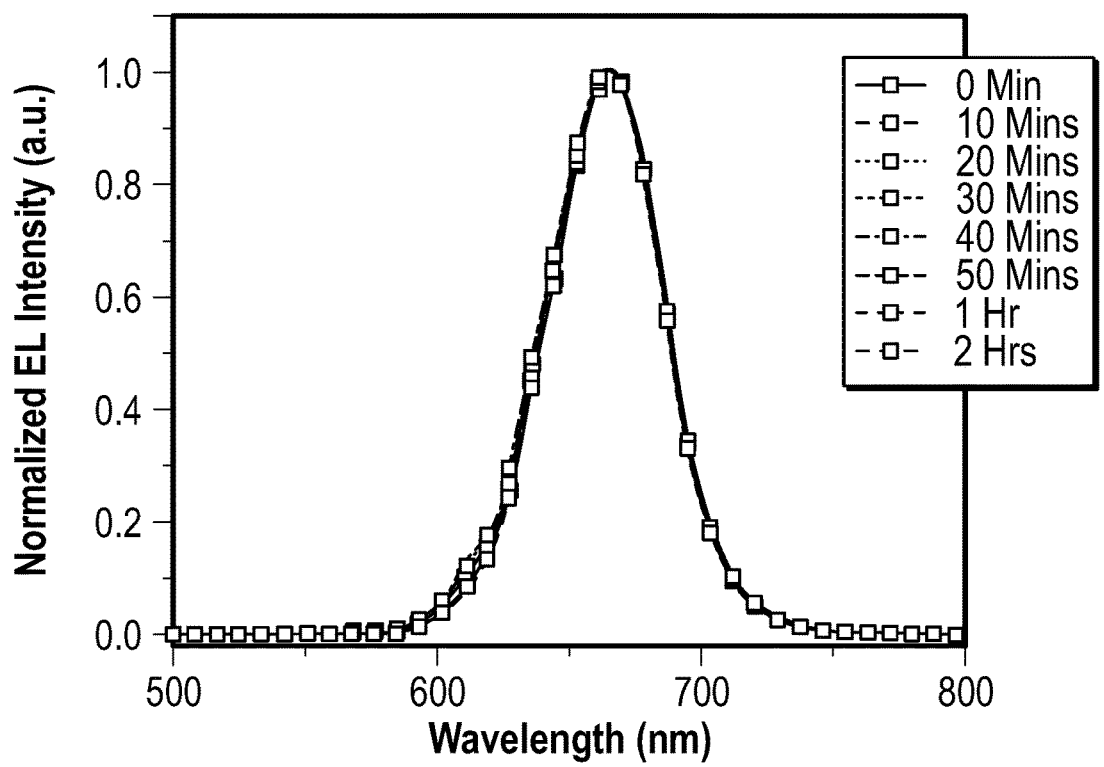
Figure 20C:
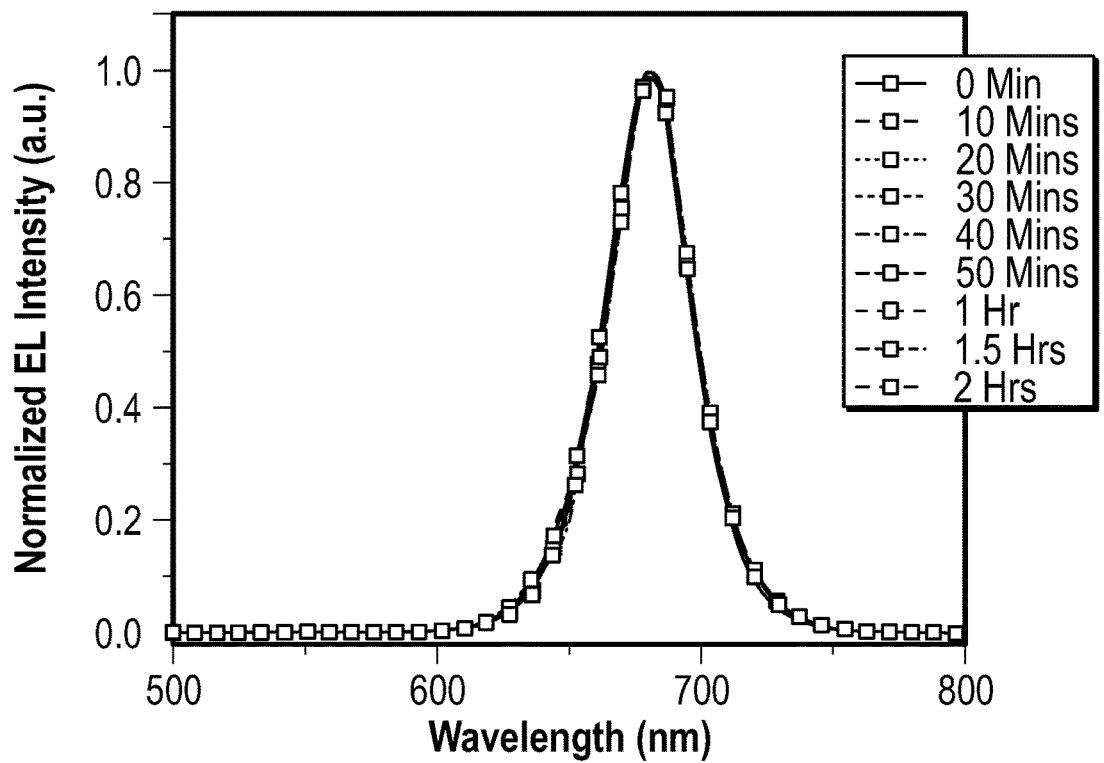
FIG. 20C and FIG. 20D depict the EL spectrum stability of an embodiment of a device at 4.5 V and at 5.5 V, respectively.
Figure 20D:
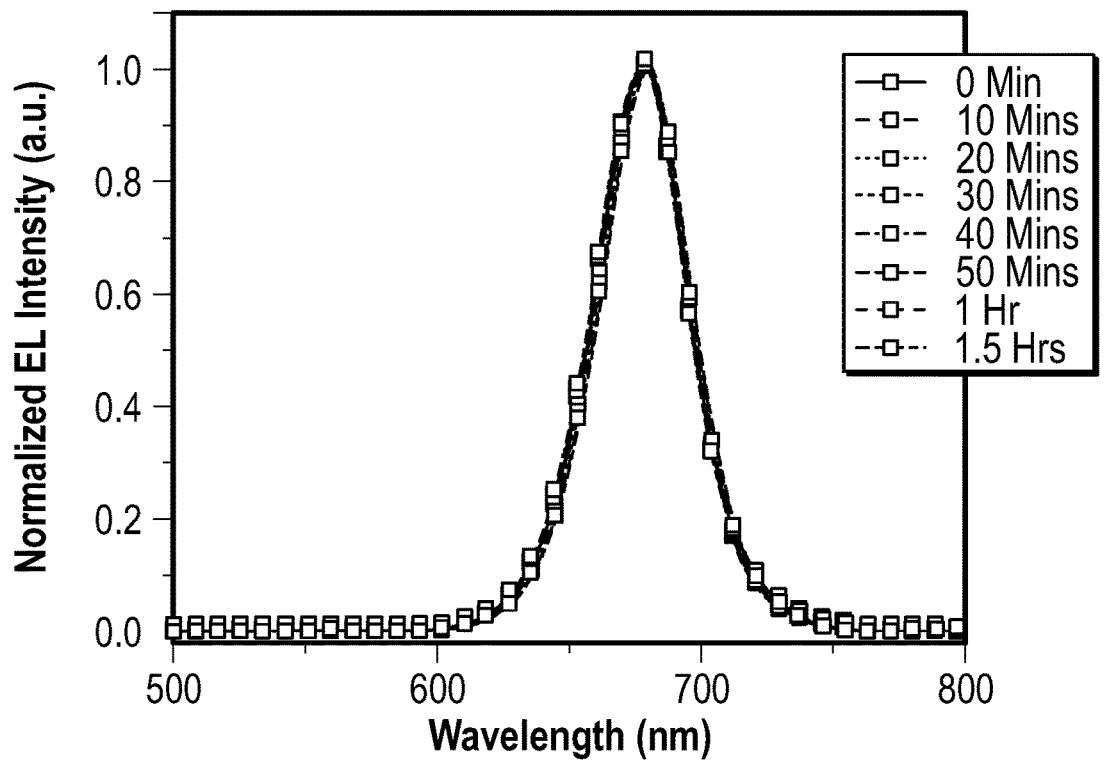
Figure 21:
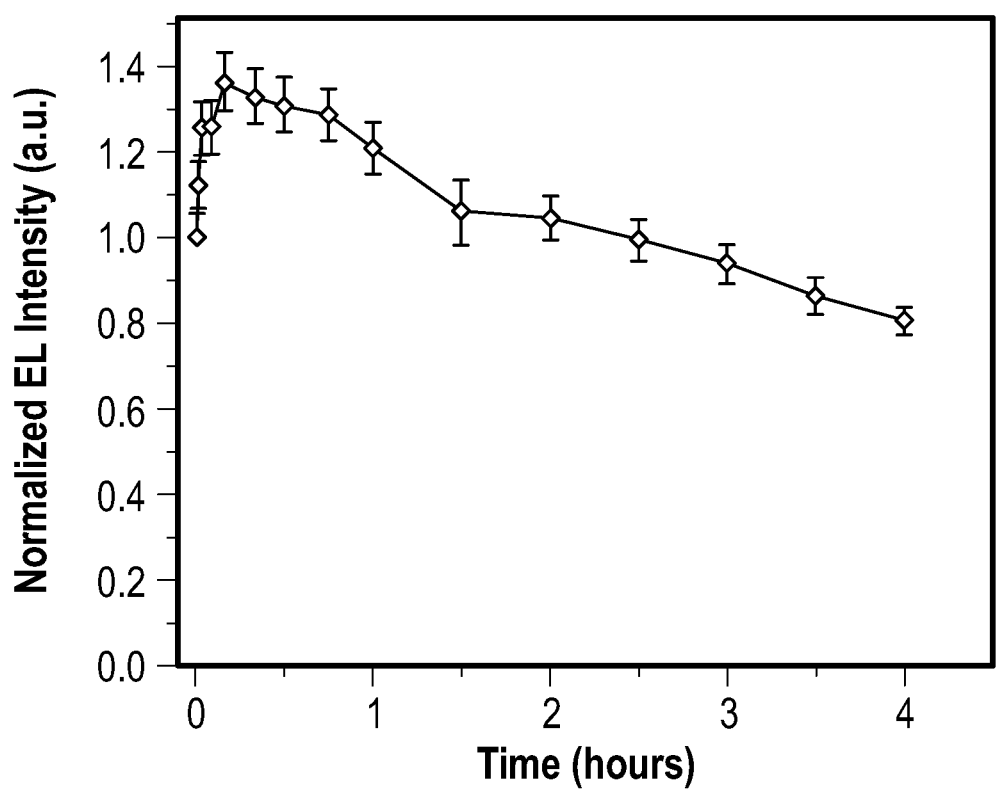
FIG. 21 depicts a normalized EL intensity over 4 hours at 3.5 V for embodiments of devices.

For the devices based on composite films No. 2 and No. 3, spectral stability also was recorded under increased operation voltages at 4.5 V and 5.5 V. FIG. 20A and FIG. 20B depict the EL spectrum stability of device No. 2 at 4.5 V and 5.5 V, respectively. FIG. 20C and FIG. 20D depict the EL spectrum stability for device No. 3 at 4.5 V and at 5.5 V, respectively. These devices also showed favorable operational stability in air, with an EL intensity that dropped about 20% after 4 hours of continuous operation, as depicted at FIG. 21. FIG. 21 depicts a normalized EL intensity under 3.5 V operation for 4 hours.

The enhanced device stability can be attributed to one or more factors, including the high stability of cesium cation based perovskites, the high stability of quasi-2D perovskites structure, the uniform pinhole-free quasi-2D perovskite films, and/or the suppression of ion migration.

Multiple measurements were performed for devices with and without PEO from different batches. In total, 80 devices from different batches were fabricated and measured. In particular, the device numbers were 8, 12, 16 and 12 for device No. 1, No. 2, No. 3 and No. 4, respectively. For devices without PEO, 8 devices were fabricated and tested for each condition. The error analysis was based on the average performance of maximum EQE % values collected from 80 devices. The average Max. EQE % for No. 1, No. 2, No. 3 and No. 4 were 0.37%, 2.72%, 6.20% and 4.68%, respectively. The average Max. EQE % for No. 5, No. 6, No. 7 and No. 8 were 0.31%, 1.26%, 2.47% and 1.72%, respectively. Five devices in total were tested to prove device operation stability.

Materials and Equipment:

PEDOT:PSS, PEO ($M_w$=600,000), CsI, PbI$_2$, TPBi, LiF, and Al were purchased from Sigma Aldrich and used as received. Poly-TPD ($M_w$=80-150 KDa) was purchased from Solaris Chem Inc. For the abbreviations of the chemicals, PEODOT:PSS=Poly(3,4-ethylenedioxythiophene)-polystyrene sulfonate; PEO=Poly(ethylene oxide); Poly-TPD=Poly (4-butylphenyl-diphenyl-amine); TPBi=2,2',2"-(1,3,5-Benzinetriyl)-tris(1-phenyl-1-H-benzimidazole). Pre-patterned ITO-coated glass substrates (20 Ω/sq) with size of 18 mm*18 mm±0.2 mm were purchased from the Film Devices Inc.

Instruments and Procedures:

Film optical absorption was measured in a CARY™ 5000 UV-Vis NIR spectrophotometer. The photoluminescence (PL) spectra were measured on a HORIBA™ iHR320 spectrofluorimeter, equipped with a HORIBA™ Synapse CCD detection system. A 100 W mercury arc lamp coupled with a 420 nm long pass filter was used as the excitation light source. Photoluminescence efficiencies were measured by a HAMAMATSU™PL quantum yield C11347 spectrometer. Emission decay kinetics, not including TTA-UC emission, were collected at room temperature using an EDINBURGH™ FLS980 fluorescence spectrometer. The emission decay traces were acquired using time-correlated single-photon counting (TCSPC; 1024 channels; 100 ns window) with data collection for 10000 counts. TCSPC excitation was provided by an EDINBURGH™ EPL-360 ps pulsed light-emitting diode (405±10 nm, pulse width 892 ps) operated at 10 MHz. Emission was passed through a single grating (1800 l/mm, 500 nm blaze) CZERNY-TURNER™ monochromator and detected by a Peltier-cooled HAMAMATSU™ R928 photomultiplier tube. Emission decay kinetics for the films were fitted with a biexponential function $y=A_1 e^{-k_1 x}+A_2 e^{-k_2 x}+y_0$ using the EDINBURGH™ software package, and a weighted average lifetime calculated using $<\tau>=\Sigma A_i \tau_i^2/\Sigma A_i \tau_i$.

The thickness of films was determined by a DEKTAK™ 150 profilometer. Atomic force microscopy (AFM) images were taken with a BRUKER ICON™ scanning probe microscope in tapping-mode. X-Ray Diffraction was performed by a PANALYTICAL X'PERT™ Pro powder X-ray diffractometer.

The invention claimed is:

1. A composite material comprising:
a metal halide perovskite crystal comprising a unit cell according to formula (I)—

$$(RNH_3)_2(IC)_{n-1}M_nX_{3n+1} \qquad (I),$$

wherein IC is an inorganic cation comprising a monovalent metal,
R is a monovalent $C_1$-$C_{20}$ hydrocarbyl,
M is a metal selected from the group consisting of Pb, Sn, Cu, Ge, Mn, Co, and Eu,
X is a halide selected from the group consisting of Cl, Br, and I, and
n is an integer equal to or greater than 2; and
a polymeric matrix material in which the metal halide perovskite crystal is dispersed;
wherein the composite material is a film having a thickness of about 10 nm to about 250 nm, and
wherein the metal halide perovskite crystal has a quasi-2D structure.

2. The composite material of claim 1, wherein the polymeric matrix material comprises poly(ethylene oxide).

3. The composite material of claim 1, wherein the metal halide perovskite crystal is dispersed substantially evenly in the polymeric matrix material.

4. The composite material of claim 1, wherein the film has a thickness of about 25 nm to about 75 nm.

5. An electronic device comprising:
an electrode,
a counterelectrode, and
the composite material of claim 1;
wherein the composite material is arranged between the electrode and the counterelectrode.

6. The electronic device of claim 5, wherein the electronic device is a light-emitting diode (LED), and the composite material is configured to emit light.

7. The device of claim 5, further comprising at least one of a layer selected from the group consisting of a hole transporting layer, a hole injecting layer, a hole blocking layer, an electron transporting layer, an electron injecting layer, and an electron blocking layer.

8. The device of claim 5, further comprising:
a hole transporting layer, and
a hole injecting layer;
wherein the hole transporting layer is arranged between the composite material and the electrode, and the hole injecting layer is arranged between the hole transporting layer and the electrode.

9. The device of claim 5, further comprising an electron transporting layer arranged between the composite material and the counterelectrode.

10. The device of claim 5, wherein (i) the electrode is an anode, (ii) the counterelectrode is a cathode, (iii) the composite material is configured to emit light, and (iv) the device further comprises:
a hole injecting layer arranged adjacent to and in contact with the anode;
a hole transporting layer arranged between and in contact with both the hole injecting layer and the composite material; and
an electron transport layer arranged between and in contact with both the composite material and the cathode;
wherein the hole injecting layer comprises PEDOT:PSS, the hole transporting layer comprises poly-TPD, and the electron transport layer comprises TPBi.

11. A method of forming a composite material, the method comprising:
providing a precursor liquid comprising (i) (IC)X, (ii) $MX_2$, (iii) an organic ammonium halide salt, (iv) a polymeric matrix material, and (v) a polar organic liquid; and
depositing the precursor liquid on a surface to form a film;
wherein M is a metal selected from the group consisting of Pb, Sn, Cu, Ge, Mn, Co, and Eu,
IC is an inorganic cation comprising a monovalent metal, and
X is a halide selected from the group consisting of Cl, Br, and I.

12. The method of claim 11, further comprising annealing the film.

13. The composite material of claim 1, wherein n is 2 to 9.

14. The composite material of claim 1, wherein the monovalent metal comprises an alkali metal.

15. The composite material of claim 1, wherein the alkali metal is Cs.

16. The composite material of claim 1, wherein the monovalent $C_1$-$C_{20}$ hydrocarbyl is a benzyl moiety.

17. The composite material of claim 1, wherein M is Pb.

18. The composite material of claim 1, wherein X is I.

* * * * *